(12) United States Patent
Aitken et al.

(10) Patent No.: US 9,786,370 B2
(45) Date of Patent: Oct. 10, 2017

(54) CES-BASED LATCHING CIRCUITS

(71) Applicant: ARM Ltd., Cambridge (GB)

(72) Inventors: Robert Campbell Aitken, San Jose, CA (US); Vikas Chandra, San Jose, CA (US); Bal S. Sandhu, Fremont, CA (US); George McNeil Lattimore, Austin, TX (US); Shidhartha Das, Upper Cambourne (GB); John Philip Biggs, Cambridge (GB); Parameshwarappa Anand Kumar Savanth, Cambridge (GB); James Edward Myers, Bottisham (GB)

(73) Assignee: ARM Ltd., Cambridge (GB)

( * ) Notice: Subject to any disclaimer, the term of this patent is extended or adjusted under 35 U.S.C. 154(b) by 0 days.

(21) Appl. No.: 15/051,359

(22) Filed: Feb. 23, 2016

(65) Prior Publication Data

US 2017/0243621 A1    Aug. 24, 2017

(51) Int. Cl.
*G11C 14/00* (2006.01)
*G11C 13/00* (2006.01)

(52) U.S. Cl.
CPC ........ *G11C 14/009* (2013.01); *G11C 13/0007* (2013.01)

(58) Field of Classification Search
CPC .......................... G11C 14/0081; G11C 14/009
See application file for complete search history.

(56) References Cited

U.S. PATENT DOCUMENTS

| 7,298,640 | B2 | 11/2007 | Chen et al. |
| 7,639,523 | B2 | 12/2009 | Celinska et al. |
| 7,778,063 | B2 | 8/2010 | Brubaker et al. |
| 7,872,900 | B2 | 1/2011 | Paz De Araujo et al. |
| 9,558,819 | B1 | 1/2017 | Aitken et al. |
| 9,584,118 | B1 | 2/2017 | Dao et al. |
| 9,589,636 | B1 | 3/2017 | Bhavnagarwala et al. |
| 2006/0181916 | A1 | 8/2006 | Roehr |
| 2008/0106925 | A1 | 5/2008 | Paz De Araujo et al. |
| 2008/0106926 | A1 | 5/2008 | Brubaker |
| 2008/0107801 | A1 | 5/2008 | Celinska et al. |
| 2013/0200323 | A1 | 8/2013 | Pham et al. |
| 2013/0214232 | A1 | 8/2013 | Tendulkar et al. |

(Continued)

OTHER PUBLICATIONS

Notification of Transmittal of The International Search Report and the Written Opinion of the International Searching Authority, or the Declaration, International Application No. PCT/GB2017/050336, dated Jun. 27, 2017, 1 pg.

(Continued)

*Primary Examiner* — Harry W Byrne
*Assistant Examiner* — R Lance Reidlinger
(74) *Attorney, Agent, or Firm* — Berkeley Law & Technology Group, LLP

(57) ABSTRACT

According to one embodiment of the present disclosure, a device comprises a latching circuitry, where the latching circuitry comprises at least one correlated electron random access memory (CeRAM) element. The latching circuitry further comprises a control circuit coupled to the at least one CeRAM element. The control circuit is configured to receive at least one control signal. Based on the at least one control signal, perform at least one of storing data into the latching circuitry and outputting data from the latching circuitry.

16 Claims, 13 Drawing Sheets

(56) References Cited

U.S. PATENT DOCUMENTS

| | | |
|---|---|---|
| 2013/0285699 A1 | 10/2013 | McWilliams et al. |
| 2014/0149773 A1* | 5/2014 | Huang ............... G11C 13/0007 |
| | | 713/323 |
| 2015/0294713 A1* | 10/2015 | Beat ....................... G11O 5/025 |
| | | 365/154 |
| 2016/0246539 A1* | 8/2016 | Sadd ..................... G06F 3/0647 |
| 2017/0033782 A1 | 2/2017 | Shifren et al. |
| 2017/0045905 A1 | 2/2017 | Sandhu et al. |
| 2017/0047116 A1 | 2/2017 | Sandhu et al. |
| 2017/0047919 A1 | 2/2017 | Sandhu et al. |
| 2017/0069378 A1 | 3/2017 | Shifren et al. |

OTHER PUBLICATIONS

International Searching Report, International Application No. PCT/GB2017/050336, dated Jun. 27, 2017, 8 pgs.

The Written Opinion of the International Searching Authority, International Application No. PCT/GB2017/050336, dated Jun. 27, 2017, 10 pgs.

Warren Robinett et. al., "A memristor-based nonvolatile latch circuit", Nanotechnology, IOP, Bristol, GB, vol. 21, No. 23, May 17, 2010, pp. 235203, XP020192869, ISSN: 0957-4484, DOI: 10.1088/0957-4484/21/23/235203 figure 3, 6 pgs.

* cited by examiner

US 9,786,370 B2

CES-BASED LATCHING CIRCUITS

FIELD OF THE INVENTION

The present disclosure relates to data storage circuits and more particularly, to latching circuits comprising a correlated electron switch (CES) element.

BACKGROUND

Data storage circuits, for example, flip-flops and latches, are used for storing state information in digital electronic circuits. Such data storage circuits hold the data temporarily. For example, a single latch stores one bit of data as long as the latch circuit is powered. However, such data storage circuits are volatile in nature, i.e. the stored data is lost when a power supply to these data storage circuits is switched off. A conventional technique to enable latches and flip-flops to retain data includes coupling the latch or flip-flop to a retention circuit with its own separate power supply. In this technique, when the power supply to the latches and flip-flops is switched off, the stored data in the latch/flip-flop is copied to the retention circuit. However, such an approach requires redundant circuitry which requires additional space in an integrated circuit that could otherwise have been saved. Further, an additional power supply is required, thereby adding to the overall power consumption of such data storage circuits.

SUMMARY

According to one embodiment of the present disclosure, a device comprises a latching circuitry, where the latching circuitry comprises at least one correlated electron random access memory (CeRAM) element. The latching circuitry further comprises a control circuit coupled to the at least one CeRAM element. The control circuit is configured to receive at least one control signal. Based on the at least one CeRAM element and the at least one control signal, perform at least one of storing data and outputting data.

According to another embodiment of the present disclosure, a method is provided. The method comprises receiving, by a latching circuitry, at least one control signal, wherein the latching circuitry comprises at least one correlated electron random access memory (CeRAM) element. receiving, by a latching circuitry of a device, at least one control signal. The method further comprises performing at least one of storing data into the latching circuitry and outputting data from the latching circuitry based on the at least one control signal.

In a related aspect of the present technique, there is provided a non-transitory data carrier carrying code which, when implemented on a processor, causes the processor to carry out the methods described herein.

As will be appreciated by one skilled in the art, the present techniques may be embodied as a system, method or computer program product. Accordingly, present techniques may take the form of an entirely hardware embodiment, an entirely software embodiment, or an embodiment combining software and hardware aspects.

Furthermore, the present techniques may take the form of a computer program product embodied in a computer readable medium having computer readable program code embodied thereon. The computer readable medium may be a computer readable signal medium or a computer readable storage medium. A computer readable medium may be, for example, but is not limited to, an electronic, magnetic, optical, electromagnetic, infrared, or semiconductor system, apparatus, or device, or any suitable combination of the foregoing.

Computer program code for carrying out operations of the present techniques may be written in any combination of one or more programming languages, including object oriented programming languages and conventional procedural programming languages. Code components may be embodied as procedures, methods or the like, and may comprise sub-components which may take the form of instructions or sequences of instructions at any of the levels of abstraction, from the direct machine instructions of a native instruction set to high-level compiled or interpreted language constructs.

BRIEF DESCRIPTION OF THE DRAWINGS

The techniques are diagrammatically illustrated, by way of example, in the accompanying drawings, in which.

DETAILED DESCRIPTION

Figure 1:
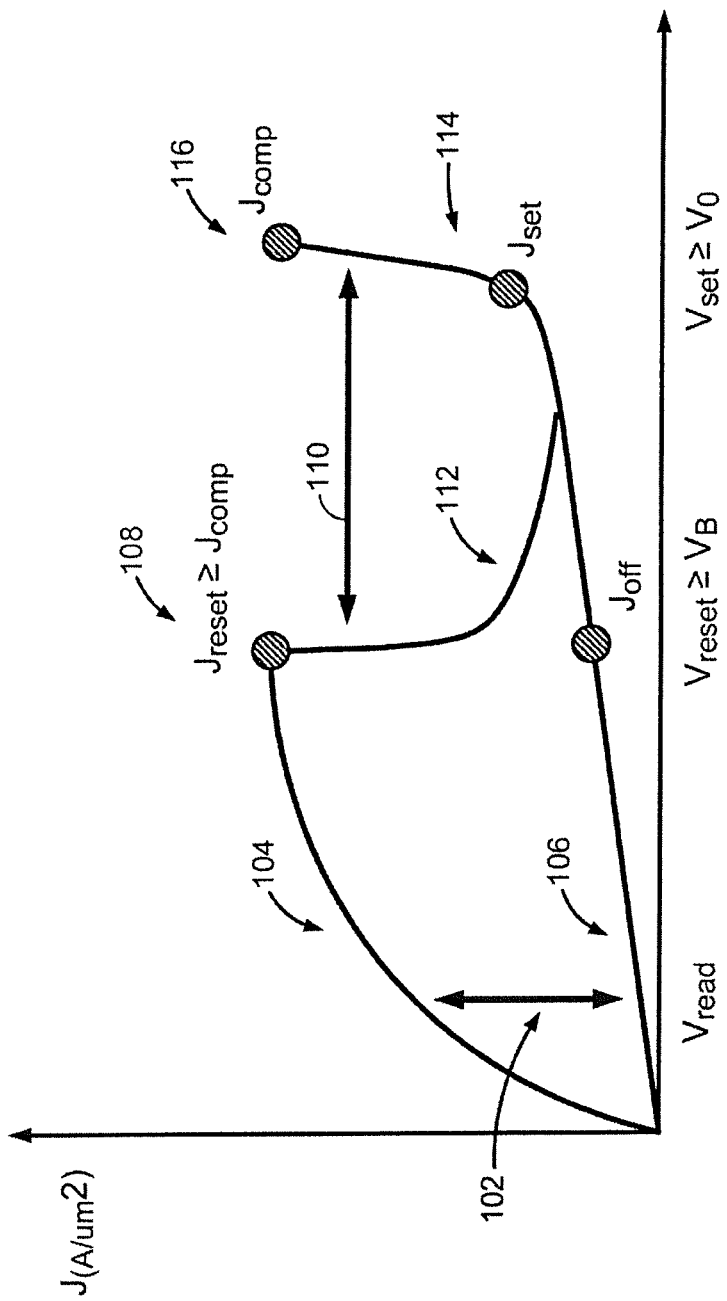
FIG. 1 shows a plot of current density versus voltage for a Correlated Electron Switch (CES) element.

Broadly speaking, embodiments of the present techniques provide a latching circuit configured to store/latch data when a power supply has been disconnected or turned off. The latching circuitry configured to latch the data comprises at least one Correlated Electron Switch (CES) element, which comprises a correlated electron material (CEM). The CES may be used both as non-volatile storage as well as a circuit element that can enable connectivity in a circuit. As explained in more detail below, the CES element comprises a material that may transition between predetermined detectable memory states based at least in part on a transition of (at least a portion of) the material between a conductive state and an insulative state. The CES element is programmable such that it may store a configuration in a non-volatile manner, and use its impedance state to enable connectivity.

The term "correlated electron switch" is used interchangeably herein with "CES", "CES element", "CES device", "correlated electron random access memory", "CeRAM", and "CeRAM device".

Non-volatile memories are a class of memory in which the memory cell or element does not lose its state after power supplied to the device is removed. In flash memory devices, an ability to keep random access (erase/write single bits) was sacrificed for speed and higher bit density. Flash remains a non-volatile memory of choice. Nevertheless, it is generally recognized that flash memory technology may not scale easily below 40 nanometers (nm); thus, new non-volatile memory devices capable of being scaled to smaller sizes are actively being sought.

A CES is a particular type of switch formed (wholly or in part) from a CEM. Generally speaking, a CES may exhibit an abrupt conductive or insulative state transition arising from electron correlations rather than solid state structural phase changes. (Examples of solid state structural phase changes include crystalline/amorphous in phase change memory (PCM) devices, or filamentary formation and conduction in resistive RAM devices, as discussed above). An abrupt conductor/insulator transition in a CES may be responsive to a quantum mechanical phenomenon, in contrast to melting/solidification or filament formation.

A quantum mechanical transition of a CES between an insulative state and a conductive state may be understood in terms of a Mott transition. In a Mott transition, a material may switch from an insulative state to a conductive state if a Mott transition condition occurs. When a critical carrier concentration is achieved such that a Mott criteria is met, the Mott transition will occur and the state will change from high resistance/impedance (or capacitance) to low resistance/impedance (or capacitance).

A "state" or "memory state" of the CES element may be dependent on the impedance state or conductive state of the CES element. In this context, the "state" or "memory state" means a detectable state of a memory device that is indicative of a value, symbol, parameter or condition, just to provide a few examples. In one particular implementation, as described below, a memory state of a memory device may be detected based, at least in part, on a signal detected on terminals of the memory device in a read operation. In another particular implementation, as described below, a memory device may be placed in a particular memory state to represent or store a particular value, symbol or parameter by application of one or more signals across terminals of the memory device in a "write operation."

In a particular implementation, a CES element may comprise material sandwiched between conductive terminals. By applying a specific voltage and current between the terminals, the material may transition between the aforementioned conductive and insulative states. As discussed in the particular example implementations below, material of a CES element sandwiched between conductive terminals may be placed in an insulative state by application of a first programming signal across the terminals having a voltage $V_{reset}$ and current $I_{reset}$ at a current density $J_{reset}$, or placed in a conductive state by application of a second programming signal across the terminals having a voltage $V_{set}$ and current $I_{set}$ at current density $J_{set}$.

Additionally or alternatively, a CES element may be provided as a memory cell in a cross-point memory array whereby the CES element may comprise a metal/CEM/metal (M/CEM/M) stack formed on a semiconductor. Such an M/CEM/M stack may be formed on a diode, for example. In example implementations, such a diode may be selected from the group consisting of a junction diode and a Schottky diode. In this context, it should be understood that "metal" means a conductor, that is, any material that acts like a metal, including, for example, polysilicon or a doped semiconductor.

FIG. 1 shows a plot of current density versus voltage across terminals (not shown) for a CES element. Based, at least in part, on a voltage applied to terminals of the CES element (e.g., in a write operation), the CES may be placed in a conductive state or an insulative state. For example, application of a voltage $V_{set}$ and current density $J_{set}$ may place the CES element in a conductive memory state and application of a voltage $V_{reset}$ and a current density $J_{reset}$ may place the CES element in an insulative memory state.

Following placement of the CES in an insulative state or conductive state, the particular state of the CES element may be detected by application of a voltage $V_{read}$ (e.g., in a read operation) and detection of, for example, a current or current density at terminals or bias across the terminals of the CES element.

Both the current and the voltage of the CES element need to be controlled in order to switch the CES element state. For example, if the CES element is in a conductive state, and voltage $V_{reset}$ required to place the device in an insulative memory state, is applied thereto, the CES element will not switch into the insulative state until the current density is also at the required value of $J_{reset}$. This means that, when the CES element is used to read/write from a memory, unintended rewrites may be prevented since even if sufficient voltage is applied to the CES element, a memory state change will only occur if the required current density is also applied.

The CES element of FIG. 1 may include any transition metal oxide (TMO), such as, for example, perovskites, Mott insulators, charge exchange insulators, and Anderson disorder insulators. In particular implementations, a CES element may be formed from switching materials such as nickel oxide, cobalt oxide, iron oxide, yttrium oxide, and perovskites such as Cr doped strontium titanate, lanthanum titanate, and the manganate family including praesydium calcium manganate, and praesydium lanthanum manganite, just to provide a few examples. In particular, oxides incorporating elements with incomplete d and f orbital shells may exhibit sufficient resistive switching properties for use in a CES device. In an embodiment, a CES element may be prepared without electroforming. Other implementations may employ other transition metal compounds without deviating from claimed subject matter. For example, {M(chxn)2Br}Br2 where M may comprise Pt, Pd, or Ni, and chxn comprises 1R,2R-cyclohexanediamine, and other such metal complexes may be used without deviating from claimed subject matter.

When sufficient bias is applied (e.g., exceeding a band-splitting potential) and the aforementioned Mott condition is met (injected electron holes=the electrons in a switching region), the CES element may rapidly switch from a conductive state to an insulative state via the Mott transition. This may occur at point 108 of the plot in FIG. 1. At this point, electrons are no longer screened and become localized. This correlation may result in a strong electron-electron interaction potential which splits the bands to form an insulator. While the CES element is still in the insulative state, current may be generated by transportation of electron holes. When sufficient bias is applied across terminals of the CES, electrons may be injected into a metal-insulator-metal (MIM) diode over the potential barrier of the MIM device. When sufficient electrons have been injected and sufficient potential is applied across terminals to place the CES element in a set state, an increase in electrons may screen electrons and remove a localization of electrons, which may collapse the band-splitting potential forming a metal.

Current in a CES element may be controlled by an externally applied "compliance" condition determined based, at least in part, on the external current limited during a write operation to place the CES element in a conductive state. This externally applied compliance current may also set a condition of a current density for a subsequent reset operation to place the CES in an insulative state.

As shown in the particular implementation of FIG. 1, a current density $J_{comp}$ applied during a write operation at point 116 to place the CES element in a conductive state may determine a compliance condition for placing the CES element in an insulative state in a subsequent write operation. For example, the CES element may be subsequently placed in an insulative state by application of a current density $J_{reset} \geq J_{comp}$ at a voltage $V_{reset}$ at point 108, where $J_{comp}$ is externally applied.

The compliance condition therefore may set a number of electrons in a CES element which are to be "captured" by holes for the Mott transition. In other words, a current applied in a write operation to place a CES element in a conductive memory state may determine a number of holes to be injected to the CES element for subsequently transitioning the CES element to an insulative memory state.

As pointed out above, a reset condition may occur in response to a Mott transition at point 108. As pointed out above, such a Mott transition may occur at condition in a CES element in which a concentration of electrons n equals a concentration of electron holes p.

A current or current density in a region 104 of the plot shown in FIG. 1 may exist in response to injection of holes from a voltage signal applied across terminals of a CES element. Here, injection of holes may meet a Mott transition criterion for the conductive state to insulative state transition at current IMI as a critical voltage VMI is applied across terminals of CES element.

A "read window" 102 for detecting a memory state of a CES element in a read operation may be set out as a difference between a portion 106 of the plot of FIG. 1 while the CES element is in an insulative state, and a portion 104 of the plot of FIG. 1 while the CES element is in a conductive state at a read voltage $V_{read}$.

Similarly, a "write window" 110 for placing a CES element in an insulative or conductive memory state in a write operation may be set out as a difference between $V_{reset}$(at $J_{reset}$) and $V_{set}$(at $J_{set}$). Establishing $|V_{set}|>|V_{reset}|$ enables a switch between conductive and insulative states. $V_{reset}$ may be approximately at a band splitting potential arising from correlation and $V_{set}$ may be approximately twice the band splitting potential. In particular implementations, a size of write window 110 may be determined, at least in part, by materials and doping of the CES element. The transition from high resistance (or high capacitance) to low resistance (or low capacitance) can be represented by a singular impedance of the device.

Figure 2:
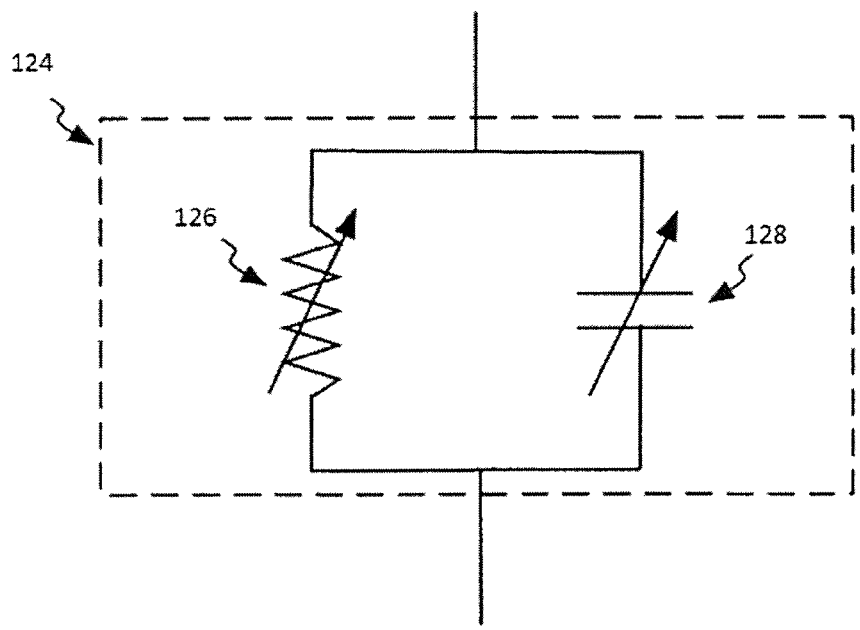
FIG. 2 is a schematic diagram of an equivalent circuit to a CES device.

FIG. 2 depicts a schematic diagram of an equivalent circuit of an example variable impeder device (such as a CES device), such as variable impeder device 124. As mentioned, variable impeder device 124 may comprise characteristics of both variable resistance and variable capacitance. For example, an equivalent circuit for a variable impeder device may, in an embodiment, comprise a variable resistor, such as variable resistor 126 in parallel with a variable capacitor, such as variable capacitor 128.

Although the variable resistor 126 and variable capacitor 128 are depicted in FIG. 2 as discrete components, variable impeder device 124 may equally comprise a substantially homogenous CES element, wherein the CES element comprises characteristics of variable capacitance and variable resistance. Table 1 below depicts an example truth table for an example variable impedance device, such as variable impeder device 124.

TABLE 1

| Resistance | Capacitance | Impedance |
|---|---|---|
| $R_{high}(V_{applied})$ | $C_{high}(V_{applied})$ | $Z_{high}(V_{applied})$ |
| $R_{low}(V_{applied})$ | $C_{low}(V_{applied})$~0 | $Z_{low}(V_{applied})$ |

Figure 3:
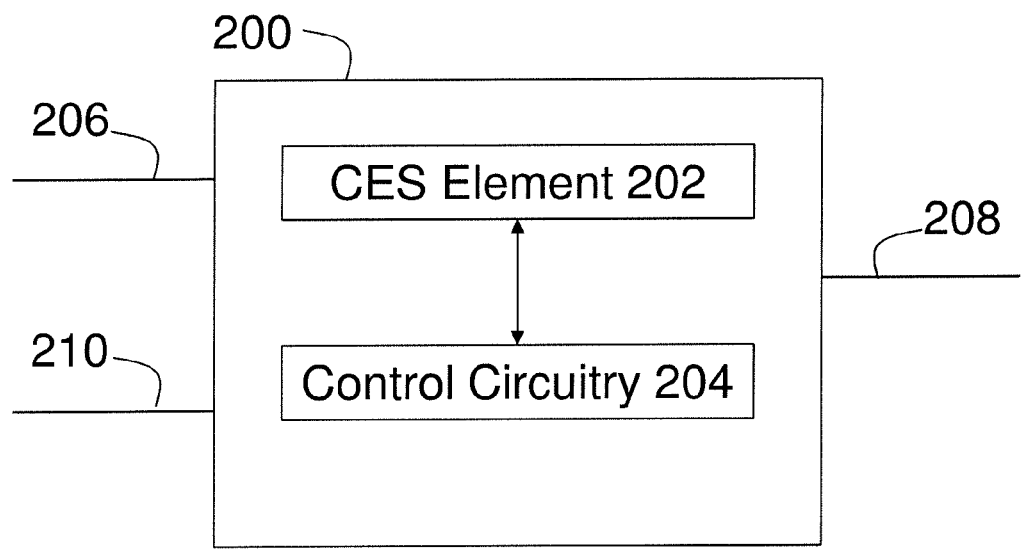
FIG. 3 is a block diagram of a CES element-based latching circuitry.

FIG. 3 illustrates a block diagram of latching circuitry 200, according to an embodiment of the present techniques. The latching circuitry 200 may be implemented in a digital electronic circuit. The digital electronic circuit may be present in devices such as microprocessors, microcontrollers, memory devices, communication modules or any devices including latching circuits. Such a device may be incorporated in electronic devices or consumer electronic devices, such as laptops, desktops, tablets, mobile phones, calculators, personal digital assistants (PDAs), and the like.

The latching circuitry 200 may comprise at least one Correlated Electron Switch (CES) element 202 and control circuitry 204. The latching circuitry 200 may take the form of, for example, a flip-flop, a latch, or a circuit configured for storing data, though it will be appreciated that these are non-limiting examples. In an example where the latching circuitry 200 is a flip-flop, the flip-flop may include a master flip-flop and a slave flip-flop. The at least one CES element 202 may be coupled to a master flip-flop, or to a slave flip-flop, or both.

The control circuitry 204 is configured to receive at least one control signal. Based on the control signal, the control circuitry 204 is configured to perform at least one of the following actions: store data and output data. To store data, the control circuitry 204 may program the CES element 202 into one of a plurality of impedance states based on the data to be stored. In an example, the data to be stored may be received through a data input 210. For example, when the data to be stored is at a first logic level, the control circuitry 204 may program the at least one CES element 202 to a first impedance state. The first impedance state may be a low impedance state or a high impedance state, as explained below in more detail. Similarly, when the data to be stored is at a second logic level, the control circuitry 204 may program the at least one CES element 202 to a second impedance state. The second impedance state may be a low impedance state or a high impedance state, as explained below in more detail. An impedance state of the CES element 202 may correspond to a resistive state, a capacitive state or a combination thereof. In embodiments, the CES element 202 may be in the low impedance state when a data input is at logic zero, and the CES element 202 may be in the high impedance state when the data input is at logic one.

In these examples where the control circuitry 204 stores data using the CES element 202, the control signal received by the control circuitry 204 may be at least one of a write enable signal and a clock signal. In an example, the latching circuitry 200 may receive the control signal through at least one control input 206.

To output, the control circuitry 204 may be configured to output data based on an impedance state of the at least one CES element 202. For instance, when the at least one CES element 202 is at the first impedance state, the control circuitry 204 may output a first output. Similarly, when the at least one CES element 202 is at the second impedance state, the control circuitry 204 may output a second output. In these examples where the control circuitry 204 outputs data based on a state of the CES element 202, the control signal received by the control circuitry 204 may be at least one of a read enable signal or a clock signal. In an example, the control circuitry 200 may output data through a data output 208.

In an embodiment, the control circuitry 204 is configured to restore a state of the latching circuitry 200 based on the impedance state of the at least one CES element 202. For instance, if the at least one CES element 202 is at the first impedance state, the control circuitry 204 may restore the latching circuitry 200 to a first state. In another example, the control circuitry 204 restores the latching circuitry 200 to a second state when the at least one CES element 202 is in the second impedance state. In these examples, the control signal may be a restore signal or a clock signal. The restore signal may be understood as any analog or digital signal which may trigger the control circuitry 204 to restore the state of the latching circuitry 200. The control circuitry 204 may be configured to restore the state of the latching circuitry 200 during a power on condition, i.e., when a power supply to the latching circuitry 200 is switched on.

Various embodiments of the latching circuitry 200 are described in conjunction with FIGS. 4 to 14. The same reference numerals are used in the embodiments of FIGS. 4 to 14 to designate parts that are in common across embodiments, and the description of each figure is directed primarily at constructional or operational features that differ from other embodiments.

Figure 4:
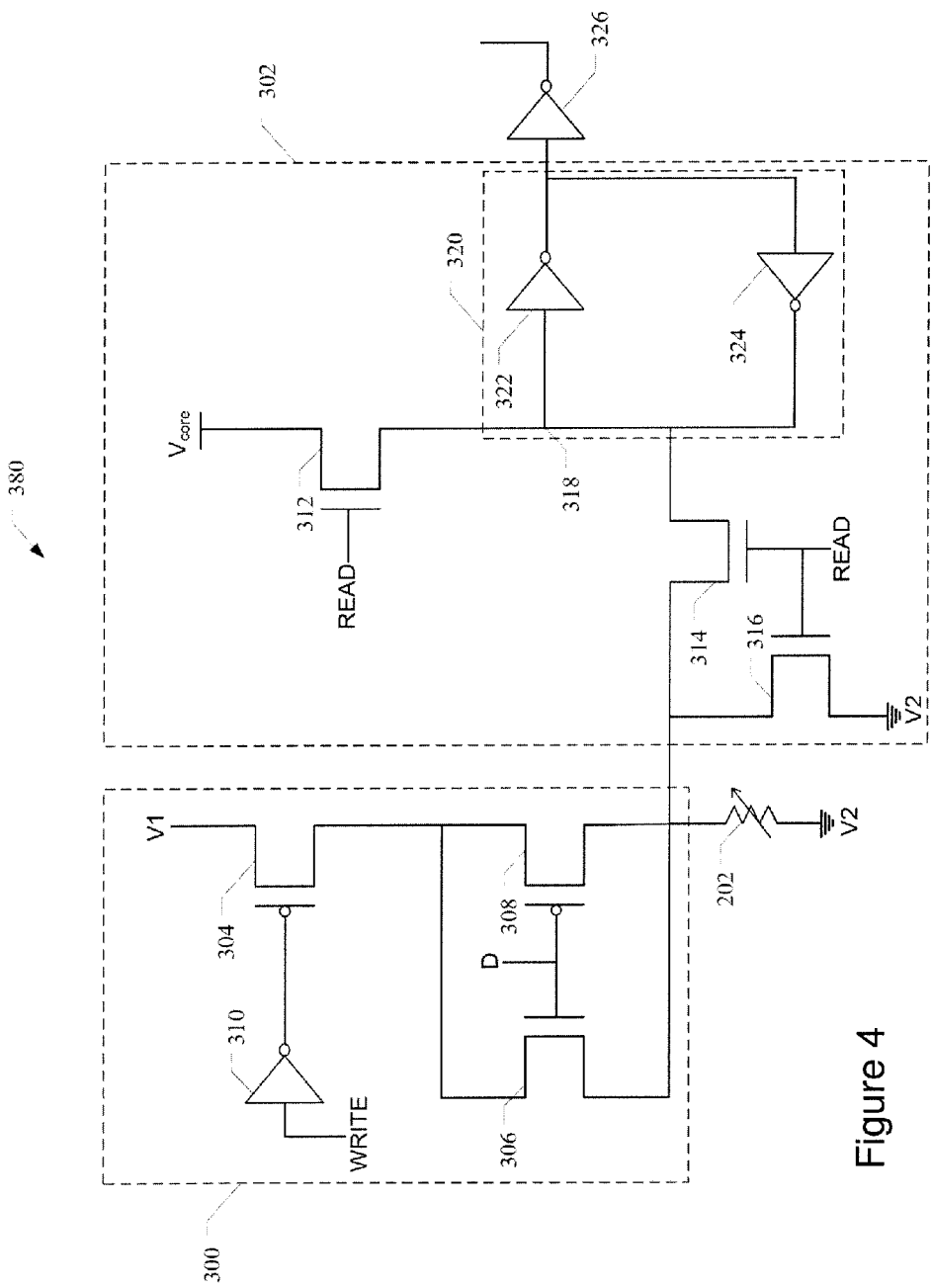
FIG. 4 illustrates an example CES element based latching circuitry having a write circuit and a read circuit.

FIG. 4 illustrates an example CES element based latching circuitry having a write circuit and a read circuit. The latching circuitry 380 includes a write circuit 300 and a read circuit 302. The write circuit 300 may be configured to store data using the CES element 202. The read circuit 302 may be configured to output data based on the CES element 202. The at least one control signal includes a write enable signal (denoted by WRITE) and a read enable signal (denoted by READ). In an example, the WRITE signal and the READ signal are asserted in a non-overlapping manner, i.e. only one of the WRITE signal and the READ signal are asserted at one time.

In a particular implementation, the write circuit 300 may comprise a transistor 304, a transistor 306, and a transistor 308. In an example, the transistor 304 may be a PMOS transistor, the transistor 306 may be an NMOS transistor, and the transistor 308 may be a PMOS transistor. A source input of the transistor 304 is coupled to a supply voltage, depicted as V1 in FIG. 4. The supply voltage may be used for supplying a defined voltage, for example, a VDD supply source. In an example implementation, VDD equals about 1.2V, but this is merely an illustrative, non-limiting example value. A gate input of the transistor 304 is configured to receive an input from an inverter 310. An input of the inverter 310 is configured to receive the write enable signal, denoted by WRITE. A drain input of the transistor 304 is coupled to a drain input of the transistor 306 and a source input of the transistor 308. A gate input of the transistor 306 is configured to receive the data, depicted as D in FIG. 4. A source input of the transistor 306 is coupled to a first input of the CES element 202. A gate input of the transistor 308 is configured to receive the data D. A drain input of the transistor 308 is coupled to the first input of the CES element 202. A second input of the CES element 202 is coupled to a second voltage supply V2. In an example, the second voltage supply V2 may be a ground GND source.

In a write operation for storing the data D, the WRITE signal is asserted, i.e. pulled to high. As a result, the transistor 304 is switched ON. Further, the write circuit 300 is configured to program the CES element 202 to one of a plurality of impedance states based on the data D to be stored. For instance, when the data D is at a logic zero, the transistor 306 is switched OFF and the transistor 308 is switched ON. As a result, the whole of VDD is supplied to the CES element 204. In an example, VDD may be greater than or equal to the SET voltage of the CES element 202. Further, the transistors 304 and 308 may be designed so as to provide a current density required for the SET state. Thus, in this example, the CES element 202 is programmed to the SET state, i.e., to a low impedance state.

In another example, where the data D is at a logic one, the transistor 306 is switched ON and the transistor 308 is switched OFF. In such a configuration, a current flows from VDD to the CES element 202 via the transistors 304 and 306. The transistor 306 may be designed to affect (cause) a voltage drop and thus, the effective voltage supplied to the CES element 202 is equal to the supply voltage minus the voltage drop introduced by the transistor 306. In an embodiment, the voltage drop may be about 0.6V, but this is merely an illustrative, non-limiting example value. Hence, the voltage supplied to the CES element 202 is about 0.6V. In an example, the voltage supplied to the CES element 202 is greater than or equal to the RESET voltage of the CES element 202. Further, the transistor 304 and 306 may be designed to provide a current density greater than or equal to the RESET current density of the CES element 202. Thus, the CES element 202 is programmed to the RESET state, i.e., the high impedance state.

As mentioned above, the read circuit 302 may be configured to output the data based on the CES element 202. In an implementation, the read circuit 302 comprises a transistor 312, a transistor 314, and a transistor 316. In an example, the transistor 312, the transistor 314, and the transistor 316 may be NMOS transistors. Further, an impedance value of the transistor 312 and the transistor 316 may be equal to twice the impedance value of the transistor 314. A drain input of the transistor 312 is configured to receive a third voltage supply, for example, a core voltage, depicted as Vcore in FIG. 4. A source input of the transistor 312 is coupled to an output node 318. A source input of the transistor 314 is coupled to the output node 318. A drain input of the transistor 314 is coupled to a drain input of the transistor 316. The drain input of the transistor 316 is further coupled to the first input of the CES element 202. A source input of the transistor 316 is coupled to the second supply. Further, gate inputs of the transistors 312, 314 and 316 are coupled to the READ signal.

In a read operation, the READ signal is asserted. The transistors 314, 316 and 318 are turned ON. The read circuit 302 is configured to output data based on an impedance state of the CES element 202. For instance, when the CES element 202 is in the low impedance state, the read circuit 302 may output a first output. In said case, the transistor 316 and the CES element 202 are connected in parallel. The CES element 202 is designed such that impedance in the low impedance state is significantly lower than the resistance of the transistor 316. Thus, the transistor 316 is effectively shorted. As a result, in a particular embodiment, a voltage at the output node 318 is equal to one third of the first supply because the transistors 312 and 314 form a resistor divider with the resistance of the transistor 312 being about twice the resistance of the transistor 314. The output node 318 is further connected to a feedback circuit 320. The feedback circuit 320 comprises an inverter 322 and an inverter 324. The output from the feedback circuit 320 is fed to an inverter 326 from which the first output is provided. As the voltage at the output node 318 is about one third of the first supply voltage, the first output is at logic zero. Thus, when the CES element 202 is in the low impedance state (the CES element 202 is in the low impedance state when the data input is at logic zero), the data output is at logic zero, thereby outputting the stored data correctly.

In another example, where the CES element 202 is in the high impedance state, the read circuit 302 may output a second output. In an embodiment, the CES element 202 is designed in a manner such its impedance in the high impedance state is significantly higher than the impedance of the transistor 316. Thus, the CES element 202 in such an arrangement may function as an open element, and offers high resistance. As a result, in particular embodiments, the effective voltage supplied to the output node 318 is equal to three fifths of the first supply voltage and thus, the second output is logic one (the CES element 202 is in the high impedance state when the data input is at logic one). Thus, the read circuit 302 outputs the stored data correctly.

As described, the write circuit 300 and the read circuit 302 are enabled by separate WRITE signal and the READ signal, respectively. Thus, when neither of the WRITE signal or the READ signal is enabled, both the write circuit 300 and the read circuit 302 are disabled, thereby preventing accidental write and read from the latching circuitry 380. Further, there are no leakage paths in the write circuit 300 and the read circuit 302.

Figure 5:
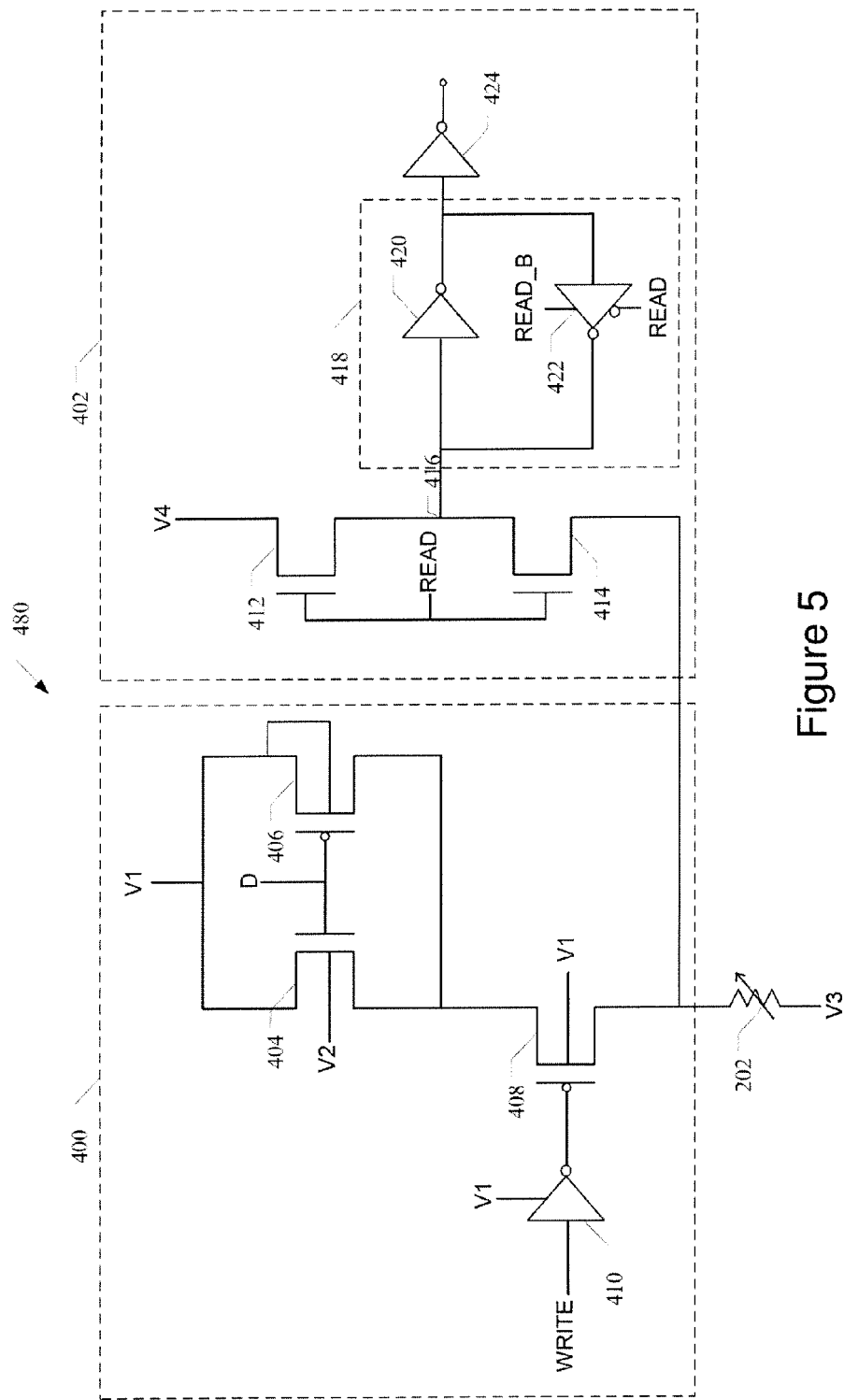
FIG. 5 illustrates a further example CES element based latching circuitry having a write circuit and a read circuit.

FIG. 5 illustrates a further example of CES element based latching circuitry 480 having a write circuit and a read circuit. The latching circuitry 480 may include a write circuit 400 and a read circuit 402. The write circuit 400 may be configured to store data using the CES element 202. The read circuit 402 may be configured to output data based on the CES element 202. The at least one control signal includes a write enable signal (denoted by WRITE) and a read enable signal (denoted by READ). In an example, the WRITE signal and the READ signal are asserted in a non-overlapping manner, i.e. only one of the WRITE signal and the READ signal are asserted at one time.

In a particular implementation, the write circuit 400 may comprise a transistor 404, a transistor 406, and a transistor 408. In an example, the transistor 404 may be an NMOS transistor, the transistor 406 may be a PMOS transistor, and the transistor 408 may a PMOS transistor. A source input of the transistor 404 is coupled to a drain input of the transistor 406. Further, the drain input of the transistor 404 is configured to receive a supply V1. A gate input of the transistor 404 is configured to receive the data, depicted as D in FIG. 5. A body input of the transistor 404 is configured to receive a supply V2, for example, Vss. A source input of the transistor 404 is coupled to a source input of the transistor 408. In addition to being coupled to the drain input of the transistor 404, the source input of the transistor 406 is also configured to receive V1. A gate input of the transistor 406 is coupled to the data and a body input of the transistor 406 is coupled to the source input of the transistor 406. A drain input of the transistor 406 is coupled to the source input of the transistor 408. A gate input of the transistor 408 is configured to receive an input from an inverter 410. The inverter 410 is configured to receive the WRITE signal. A body input of the transistor 408 is configured to receive V1.

A drain input of the transistor 408 is coupled to a first input of the CES element 202. Further, a second input of the CES element 202 is coupled to a voltage supply V3. In an example, the voltage supply V3 may be a ground GND source.

In a write operation for storing the data, the WRITE signal is asserted. As a result, the transistor 408 is switched ON. Further, the write circuit 400 is configured to program the CES element 202 to one of a plurality of impedance states based on the data D to be stored. For instance, when the data D is at a logic zero, the transistor 404 is switched OFF and the transistor 406 is switched ON. As a result, V1 is supplied to the CES element 202 in totality. In an example, V1 may be equal to about 1.2V, but this is merely an illustrative, non-limiting example value. In an example implementation, V1 may be greater than or equal to a SET voltage of the CES element 202. Further, the transistors 406 and 408 may be designed such that a current density through the CES element 202 is greater than a threshold current density at which the CES element 202 switches to the SET state. Thus, in this example, the CES element 202 is programmed to the SET state, i.e., the low impedance state, when the data D is at logic zero.

When the data is at logic one, the transistor 404 is switched ON and the transistor 406 is switched OFF. The transistor 404 may be designed to provide a voltage drop and thus, the effective voltage supplied to the CES element 202 is equal to the V1 minus the voltage drop introduced by the transistor 404. In an embodiment, the voltage drop introduced by the transistor 404 may be about 0.6V, but this is merely an illustrative, non-limiting example value. Thus, the effective voltage supplied to the CES element 202 is about 0.6V. In an example implementation, this voltage may be greater than or equal to a RESET voltage of the CES element 202. Further, the transistors 404 and 408 may be designed to provide a current density at which the CES element 202 switches to the RESET state. Thus, the CES element 202 is programmed to the RESET state, i.e., the high impedance state, when the data D is at logic one.

The read circuitry 402 comprises a transistor 412, a transistor 414, and an output node 416. In an example, the transistor 412 and the transistor 414 may be NMOS transistors. A source input of the transistor 412 is configured to receive a supply voltage V4. In an embodiment, V4 may be a core voltage equal to, for example, about 0.9V, but this is merely an illustrative, non-limiting example value. A gate input of the transistor 412 is configured to receive the READ signal in the FIG. 5. A source input of the transistor 412 is connected to the output node 416. A drain input of the transistor 414 is connected to the output node 416. A gate input of the transistor 414 is configured to receive the READ signal. A source input of the transistor 414 is connected to the first input of the CES element 202.

In a read operation, the READ signal is asserted. Further, the read circuit 402 is configured to output the data based on an impedance state of the CES element 202. For instance, when the CES element 202 is at the low impedance state, the read circuit 402 outputs a first output signal through the output node 416. In this example, due to the CES element 202 being in the low impedance state, the output node 416 is pushed to the ground node. The output node 416 is connected to a feedback circuit 418. The feedback circuit 418 comprises an inverter 420 and an inverter 422. In an example, the inverter 422 is a tri-state inverter with control signals READ and READ_B as shown. The READ_B signal is a complementary version of the READ signal. The output from the feedback circuit 418 is provided as an input to an inverter 424. Subsequently, the data output connected to an output of the inverter 424 is at logic zero. Thus, when the CES element 202 is in the low impedance state (the CES element 202 is in the low impedance state when the data input is at logic zero), the data output is at logic zero, thereby outputting the stored data correctly.

Similarly, when the CES element 202 is at the high impedance state, the read circuit 402 outputs a second output through the output node 416. In this example, the output node 416 is pulled high and consequently, the data output is at logic one. Thus, when the CES element 202 is in the high impedance state (the CES element 202 is in the high impedance state when the data input is at logic one), the data output is at logic one, thereby outputting the stored data correctly.

As described, the write circuit 400 and the read circuit 402 are enabled by separate WRITE signal and the READ signal, respectively. Thus, when neither of the WRITE signal or the READ signal is enabled, both the write circuit 400 and the read circuit 402 are disabled, thereby preventing accidental write and read from the latching circuitry 480. Further, there are no leakage paths in the write circuit 400 and the read circuit 402. In addition, the read circuit 402 avoids DC path during the read operation. Further, the write circuit 400 improves set-up and charge storage issues during the write operation.

In an embodiment, additional variants of the latching circuitry 380 and 480 may be formed by interchanging the write circuits and the read circuits. For example, in the latching circuitry 380 (shown in FIG. 4), the write circuit 300 may be replaced by the write circuit 400 or the read circuit 302 may be replaced by the read circuit 402. Similarly, in the latching circuitry 480 (shown in FIG. 5), the write circuit 400 may be replaced by the write circuit 300 or the read circuit 402 may be replaced by the read circuit 302.

Figure 6:
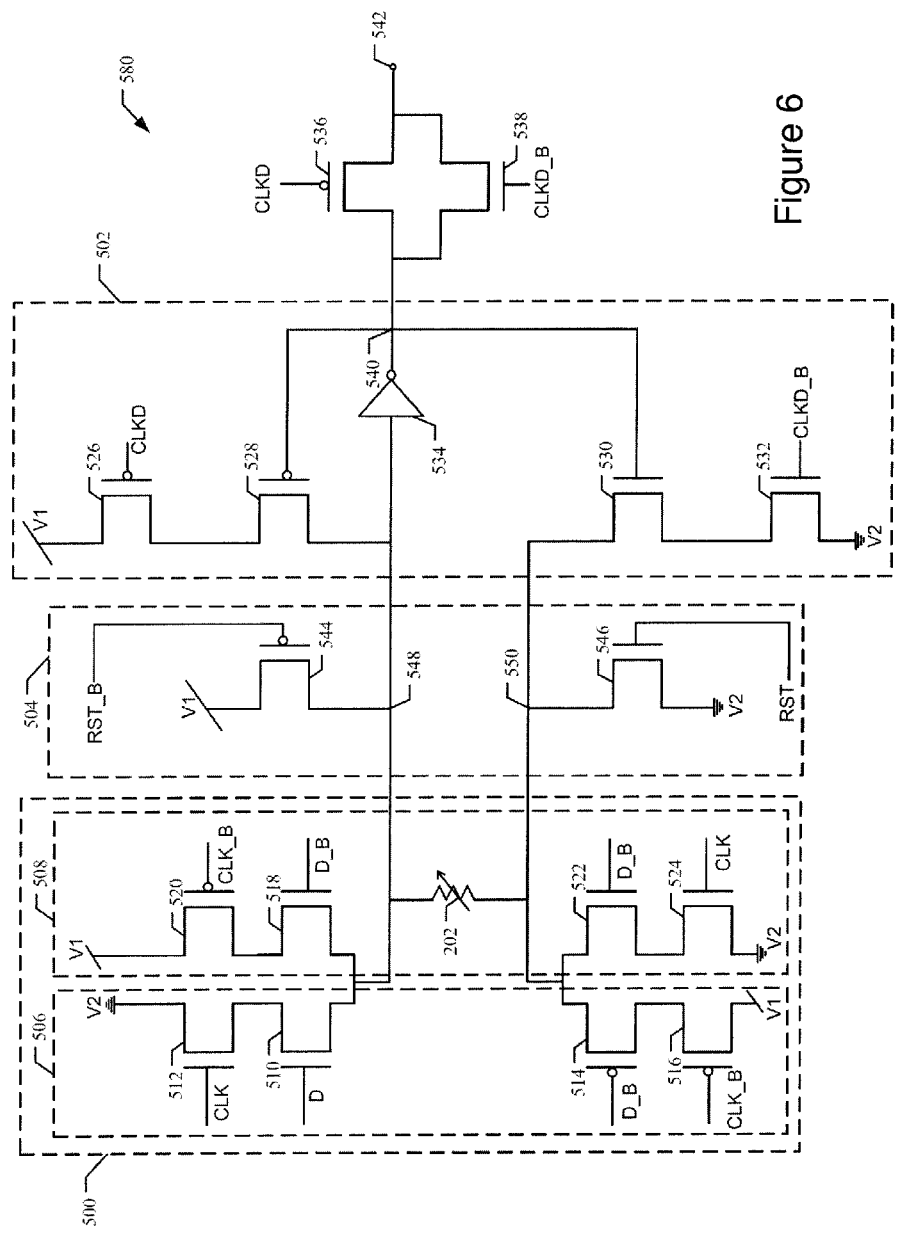
FIG. 6 illustrates an example flip-flop circuit for a CES element based latch, having a write circuit, a read circuit and a restore circuit.

FIG. 6 illustrates an example flip-flop circuit for a CES element based latching circuitry 580. In an example, the latching circuitry 580 may be a flip-flop, for example, a master-slave flip-flop. According to one embodiment, the latching circuitry 580 is a master-slave D flip-flop, which holds the state even when the power is turned off due to the non-volatile nature of the CES element. The latching circuitry 580 comprises a write circuit 500, a read circuit 502, and a restore circuit 504. The write circuit 500 is configured to store data using the CES element 202. The read circuit 502 is configured to output data based on the CES element 202. The restore circuit 504 is configured to restore a state of the latching circuitry 580 based on the CES element 202.

In a particular implementation, the write circuit 500 comprises a transistor stack 506 and a transistor stack 508. Both the transistor stack 506 and the transistor stack 508 are coupled to the CES element 202. The transistor stack 506 and the transistor 508 may together form an input to a master stage of the latching circuitry 580. The transistor stack 506 comprises a transistor 510, a transistor 512, a transistor 514, and a transistor 516. The transistor stack 508 comprises a transistor 518, a transistor 520, a transistor 522, and a transistor 524. In an example, each of the transistor 510, the transistor 512, the transistor 518, the transistor 522, and the transistor 524 may be an NMOS transistor. Each of the transistor 514, the transistor 516, and the transistor 520 may be a PMOS transistor. In an example, a gate input of the transistor 510 is configured to receive the data, depicted as D in FIG. 6. A gate input of each of the transistor 514, the transistor 518, and the transistor 522 is configured to receive complementary data, depicted as D_B in FIG. 6. Further, a gate input of the transistor 512 and the transistor 524 is configured to receive a clock signal, depicted as CLK in FIG. 6. A gate input of the transistor 516 and the transistor 520 is configured to receive a complementary clock signal, depicted as CLK_B in FIG. 6. Further, a source input of the transistor 516 and a source input of the transistor 520 are connected a first supply (denoted by V1). In an example, the first supply may be VDD. A source input of the transistor 512 and a source input of the transistor 524 are connected to a second supply (denoted by V2). In an example, the second supply may be a ground node. It will be understood that positions of the transistors in each transistor stack may be interchanged. For example, instead of connecting the transistor 510 to the CES element and the transistor 512 to the ground node as shown in FIG. 6, the transistor 512 may be connected to the CES element 202 and the transistor 510 may be connected to the ground node, and so forth.

In a read operation, the write circuit 500 stores the data using the CES element 202 when the CLK is at a first logic level, for instance, when the CLK is high, i.e., at a logic level 1. In an example, when the data is at logic one, the transistor stack 506 is configured to program the CES element 202 to a low impedance. In this example, when D is at logic one and CLK is at logic one, each of the transistor 510, the transistor 512, the transistor 514, and the transistor 516 are switched ON. As a result, VDD is applied across the CES element 202. In an example, VDD may be equal to about 1.2V, but this is merely an illustrative, non-limiting example value. VDD may be greater than or equal to the SET voltage of the CES element 202. Further, the transistor stack 506 is configured to supply a current having current density equal to or greater than a threshold current density at which the CES element 202 switches to a SET state. Under the aforementioned operating conditions, the CES element 202 is programmed to the SET state, i.e. the low impedance state.

When the data is at a logic zero, the transistor stack 508 is configured to program the CES element 202 to a high impedance state. In this example, when D is at logic zero and CLK is at logic one, each of the transistor 518, the transistor 520, the transistor 522, and the transistor 524 are switched ON. The transistor stack 508 is configured to supply a current having current density equal to or greater than a threshold current density at which the CES element 202 switches to a RESET state. Further, the transistor 518 may be configured to provide a voltage drop. Therefore, a voltage across the CES element 202 equals VDD minus the voltage drop. In an example, the voltage drop provided by the transistor 518 may be about 0.6V, but this is merely an illustrative, non-limiting example value. Consequently, the voltage across the CES element 202 is equal to about 0.6V. In an example, this voltage may be greater than or equal to the RESET voltage of the CES element 202. Under the aforesaid operating conditions, the CES element 202 is programmed to the RESET impedance state, i.e., the high impedance state. In an example, the transistor 518 may be a Negative Channel Field Effect Transistor to provide the voltage drop. A thickness of oxide of the transistor 518 may be varied to achieve a desired voltage drop. In another example, other circuit elements, for instance, another transistor (not shown in FIG. 6) may be connected to the transistor 518 to enhance the voltage drop introduced by the transistor 518. A gate input of the another transistor may be connected to a source of the another transistor to achieve a diode drop.

The read circuit 502 comprises a transistor 526, a transistor 528, a transistor 530, and a transistor 532. The transistor 528 is connected to a node 548 as shown. The node 548 is connected to a first input of the CES element 202. The transistor 530 is connected to a node 550, which is connected to a second input of the CES element 202. The transistors 528 and 530 act as feedback transistors. In an example, each of the transistor 526 and the transistor 528 may be a PMOS transistor and may be connected in series. In an example, the transistor 530 and the transistor 532 may be NMOS transistors and may be connected in series. Further, a gate input of the transistor 526 may be connected to a second clock signal, depicted as CLKD in FIG. 6. The CLKD signal is generated by performing a NAND operation of the CLK_B signal and the RST_B signal. A gate input of the transistor 532 is coupled to a complementary second clock signal, depicted as CLKD_B in FIG. 6. In an embodiment, the transistor 526 and the transistor 528 may be designed such that a combined impedance of the transistor 526 and the transistor 528 when switched ON is approximately one mega ohm (1 MΩ). Further, the transistor 530 and the transistor 532 are designed such that a combined impedance of the transistor 530 and the transistor 532 is approximately twenty thousand ohms (20,000Ω). The read circuit 502 is further coupled to an inverter 534, a pass gate transistor 536 and a pass gate transistor 538. The pass gate transistors 536 and 538 may together form an input to a slave stage of the latching circuitry 580. An input of the inverter is connected to the node 548 and an output 540 of the inverter is connected to the pass gate transistors 536 and 538. The pass gate transistors 536 and 538 are also connected to a data output 542. For reasons of brevity, an operation of the slave stage of the latching circuitry 580 is omitted as the operation of the slave stage is similar to that of a conventional slave stage of a master-slave flip-flop.

In read operation, the read circuit 502 outputs data through the input of the slave stage when the clock is at a second logic level, for instance, at logic zero while holding the data in the master stage. Further, RST signal is maintained at logic zero. Consequently, CLKD is at logic zero. When CLKD is at logic zero, the transistor 526 and the transistor 532 are switched ON. In addition, the pass gate transistor 536 and the pass gate transistor 538 are switched ON. In an example implementation, the CES element 202 may be designed such that the CES element 202 in the low impedance state may have an impedance of about one hundred thousand ohms (100,000Ω or 0.1 MΩ) and in the high impedance state may have an impedance of about ten mega ohms (10 MΩ). Thus, during the read operation, when the CES element 202 is in the low impedance state, the node 548 is pulled low. Consequently, the output 540 is pulled high and the data output 542 is at logic one. Similarly, when the CES element is in the high impedance state, the node 548 is pulled high. Consequently, the output 540 is pulled low and the data output 542 is at logic zero. Thus, the read circuit 502 correctly outputs the data depending upon an impedance state of the CES element 202.

The restore circuit 504 comprises a transistor 544 and a transistor 546. A source input of the transistor 544 is configured to receive the supply voltage V1. A gate input of the transistor 544 is configured to receive a complementary restore signal, depicted as RST_B. A drain input of the transistor 544 is coupled to the node 548. A drain input of the transistor 546 is configured to receive the supply voltage V2. In an example, the supply voltage V2 may be a ground node or GND source. A gate input of the transistor 546 is configured to receive the RST signal. A source input of the transistor 546 is coupled to the node 550. The transistor 544 is designed such that a resistance of the transistor 544 when switched ON is approximately one mega ohm (1 MΩ). The transistor 546 is designed such that a resistance of the transistor 546 when switched ON is approximately twenty kilo ohm (20 kΩ).

As mentioned above, the restore circuit 504 is configured to restore the state of the latching circuitry 580 based on the impedance state of the CES element 202. In a restore operation, the RST signal is asserted. In an embodiment, the RST signal may be a power-on-reset signal. When the RST is asserted, RST_B becomes low and the transistors 544 and 546 are turned ON. Further, CLK is de-asserted, i.e., made low. Consequently, CLKD becomes high and CLKD_B becomes low. As a result, the transistors 526 and 532 are turned OFF. When the CES element 202 is in the low impedance state having a resistance of about hundred kilo ohms (100 kΩ), the node 548 is pulled low and the output 540 is pulled high. Similarly, when the CES element 202 is in the high impedance state having a resistance of about ten mega ohms (10 MΩ), the node 548 is pulled high and the output 540 is pulled low. Thus, the restore circuit 504 is able to restore the state of the latching circuitry 580 to an appropriate state based upon the impedance state of the CES element 202.

Thus, the latching circuitry 580 may act as a non-volatile master-slave flip-flop. Further, the data may be written to the CES element 202 each time the data input to the master stage changes. Further, the restore circuit 504 is enabled using the RESTORE signal, which may be the power-on-reset signal. Therefore, the latching circuitry 580 can easily replace conventional volatile master-slave flip-flops in logic circuitry.

Figure 7:
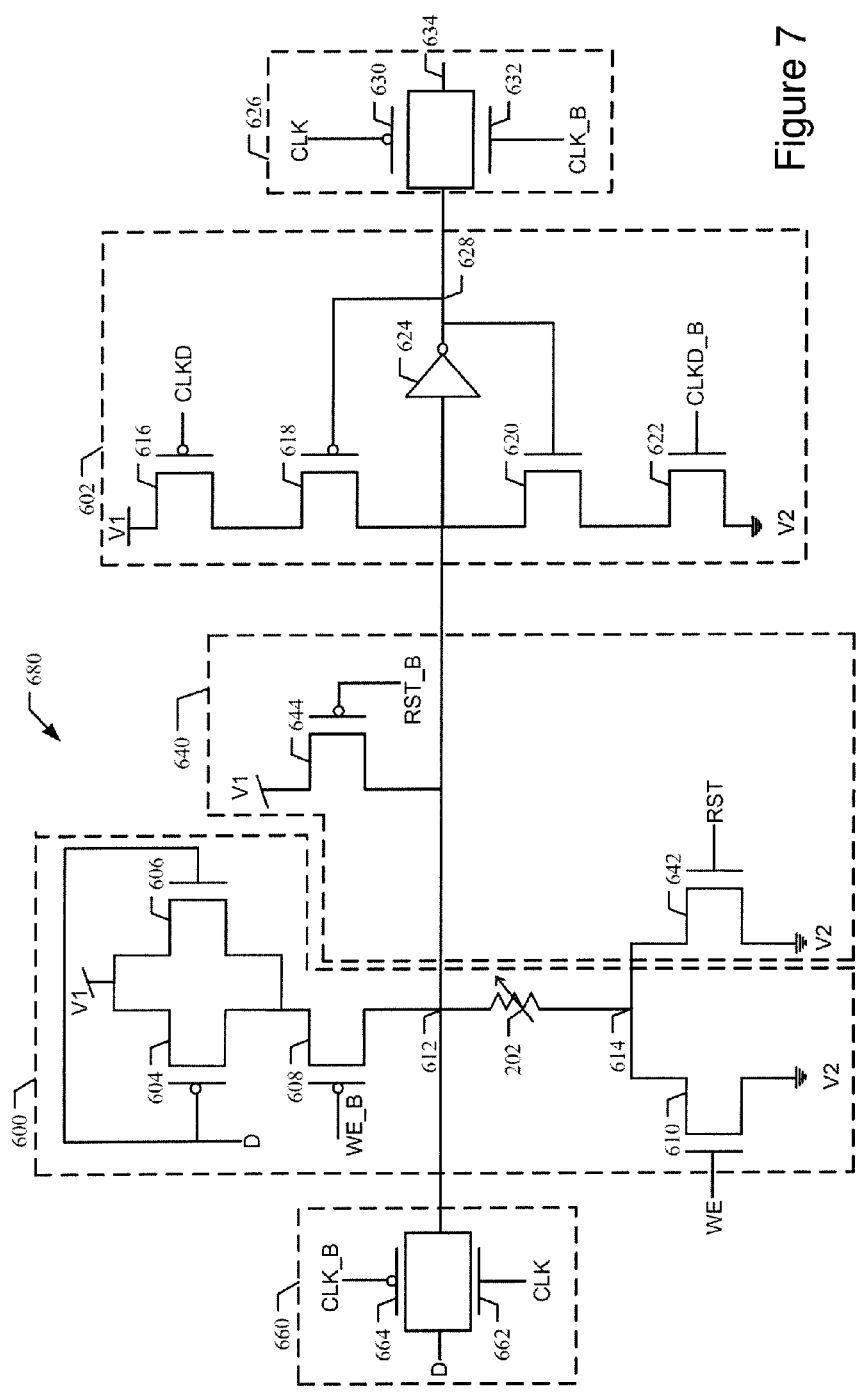
FIG. 7 illustrates a further example flip-flop circuit for a CES element based latch.

FIG. 7 illustrates a further example flip-flop circuit for a CES element based latching circuitry 680. In an example, the latching circuitry 680 may be a flip-flop. The flip-flop may be, for example, a master-slave flip-flop. The latching circuitry 680 comprises a write circuit 600, a read circuit 602, and a restore circuit 640. The write circuit 600 is configured to store data using the CES element 202. The read circuit 602 is configured to output data based on the CES element 202. The restore circuit 640 is configured to restore a state of the latching circuitry 680 based on an impedance state of the CES element 202.

In an implementation, the write circuit 600 comprises a transistor 604, a transistor 606, a transistor 608, and a transistor 610. The transistor 604 and the transistor 608 may be PMOS transistors. The transistor 606 and the transistor 610 may be NMOS transistors. Source inputs of transistors 604 and 606 are configured to receive a first supply voltage V1. In an example, V1 may be VDD. Gate inputs of the transistors 604 and 606 are configured to receive the data, depicted as D in FIG. 7. A gate input of the transistor 608 is configured to receive a complementary write enable signal, depicted as WE_B in FIG. 7. A drain input of the transistor 608 is coupled to a node 612, as depicted in FIG. 7. The node 612 is coupled to a first input of the CES element 202. A drain input of the transistor 610 is coupled to a node 614, as depicted in FIG. 7. The node 614 is coupled to a second input of the CES element. A gate input of the transistor 610 is configured to receive a write enable signal, depicted as WE in FIG. 7. A source input of the transistor 610 is configured to receive a second voltage supply, V2. In an example, the voltage supply V2 may be a ground node or GND supply.

Prior to performing a store operation, the data D is first setup to the latching circuitry 680 through an input mux 660. The input mux comprises a transistor 662 and a transistor 664, and is configured to receive the data D as input. In an example, the transistor 662 may be an NMOS transistor and the transistor 664 may be a PMOS transistor. Based on a clock signal (denoted by CLK), the input mux 660 outputs the data D which is then latched to the latching circuitry 680. A gate input of the transistor 662 is configured to receive the CLK signal and a gate input of the transistor 664 is configured to receive a complementary clock signal (denoted by CLK_B). When the clock is at logic one, the data D is latched to the latching circuitry 680.

In write operation, the WRITE signal is asserted, i.e., held high (this causes the WRITE_B signal to go low). As a result, transistors 608 and 610 are turned ON. When D is at a first logic level, for example, at logic zero, the transistor 604 is switched ON and the transistor 606 is switched OFF. As a result, VDD is applied across the CES element 202. In an example, VDD may be equal to about 1.2V, but this is merely an illustrative, non-limiting example value and may be greater than or equal to the SET voltage of the CES element 202. Further, the transistor 604 is designed in a manner so as to provide a current density required for to a SET state of the CES element 202. Under such operating conditions, the CES element 202 is programmed to a SET state, i.e. a low impedance state.

When D is at logic 1, the transistor 604 is switched OFF and the transistor 606 is switched ON. The transistor 606, when switched ON, introduces a voltage drop, say, Vth. Thus, the effective voltage applied across the CES element 202 is VDD minus Vth. In an example, the effective voltage may be equal to 0.6V (but this is merely an illustrative, non-limiting example value) and may be equal to or greater than a RESET voltage of the CES element 202. Further, the transistor 606 is designed to provide a current density required for the RESET state of the CES element 202. Under such operating conditions, the CES element is programmed to the RESET state, i.e., a high impedance state. In an implementation, a thickness of the oxide layer of the transistor 606 may be varied for increasing or decreasing the voltage drop across the CES element 202. In another implementation, a single transistor or a combination of transistors (not shown in FIG. 7) to achieve a voltage drop greater than the transistor 606 may be used for increasing the voltage drop across the CES element 202. In yet another implementation, a diode (not shown in FIG. 7) may be coupled to the transistor 606 to further increase the voltage drop.

In an example, the read circuit 602 comprises transistors 616, 618, 620, and 622. The read circuit further comprises an inverter 624, and an output mux 626. The transistors 616 and 618 may be PMOS transistors. The transistors 620 and 622 may be NMOS transistors. A source input of the transistor 616 is configured to receive the voltage supply V1, a gate input of the transistor 616 is configured to receive a second clock signal (denoted by CLKD), and a drain input of the transistor 616 is coupled to a source input of the transistor 618. The CLKD signal is generated by performing a NAND operation of the CLK_B signal and the RST_B signal. A gate input of the transistor 618 is coupled to a node 628 of the latching circuitry 680. A gate input of the transistor 620 is coupled to the node 628. A gate input of the transistor 622 is coupled to receive the complementary second clock signal (denoted by CLKD_B), and a drain input of the transistor 622 is coupled to the voltage supply V2. The output mux 626 comprises a transistor 630 and a transistor 632. The transistor 630 may be a PMOS transistor and the transistor 632 may be an NMOS transistor. In an example, the read circuit may output the data through the output mux 626, which in turn, outputs the data through an output node 634.

In a read operation, the read circuit 602 outputs data when the clock is at a second logic level, for example, logic zero. In an example, the read circuit 602 may output data in a conventional manner.

In an example, the restore circuit 640 comprises a transistor 642 and a transistor 644. A drain input of the transistor 642 is coupled to the node 614. The transistor 642 may be an NMOS transistor and the transistor 644 may a PMOS transistor. A gate input of the transistor 642 is configured to receive a restore signal (denoted by RST). A source input of the transistor 642 is coupled to the supply V2. A source input of the transistor 644 is configured to receive the supply V1. A gate input of the transistor 644 is configured to receive a complementary restore signal (denoted by RST_B). A drain input of the transistor 644 is connected to the node 612.

As mentioned above, the restore circuit 640 restores the state of the latch circuitry 680. In a restore operation, the CLK signal is at logic zero. As a result, the input mux 660 is switched OFF. Further, the CLKD signal is forced to V1 (CLKD_B is forced low). As a result, the feedback inverter formed by the transistors of the read circuit 602 is turned OFF. As a result, contention during the restore operation is averted. For restoring the state of the latch circuitry 680, the RST signal is asserted. This causes the RST_B signal to go low. As a result, the transistors 642 and 644 are switched ON. The transistor 642 and the transistor 644, when switched ON, establish a voltage across the CES element 202 for restoring the state. In an embodiment, the transistors 642 and 644 are designed in manner such that an impedance state of the transistor 644 is greater than the low impedance state of the CES element 202, and an impedance of the transistor 642 is lower than the low impedance state of the CES element 202. As a result, when the CES element 202 is in the low impedance state, the node 612 is pulled low, i.e. to logic zero. On the other hand, when the CES element is in the high impedance state, the node 612 is pulled high, i.e. to logic one. Thus, based on the impedance state of the CES element 202, the proper state of the latching circuitry 680 is restored.

Figure 8:
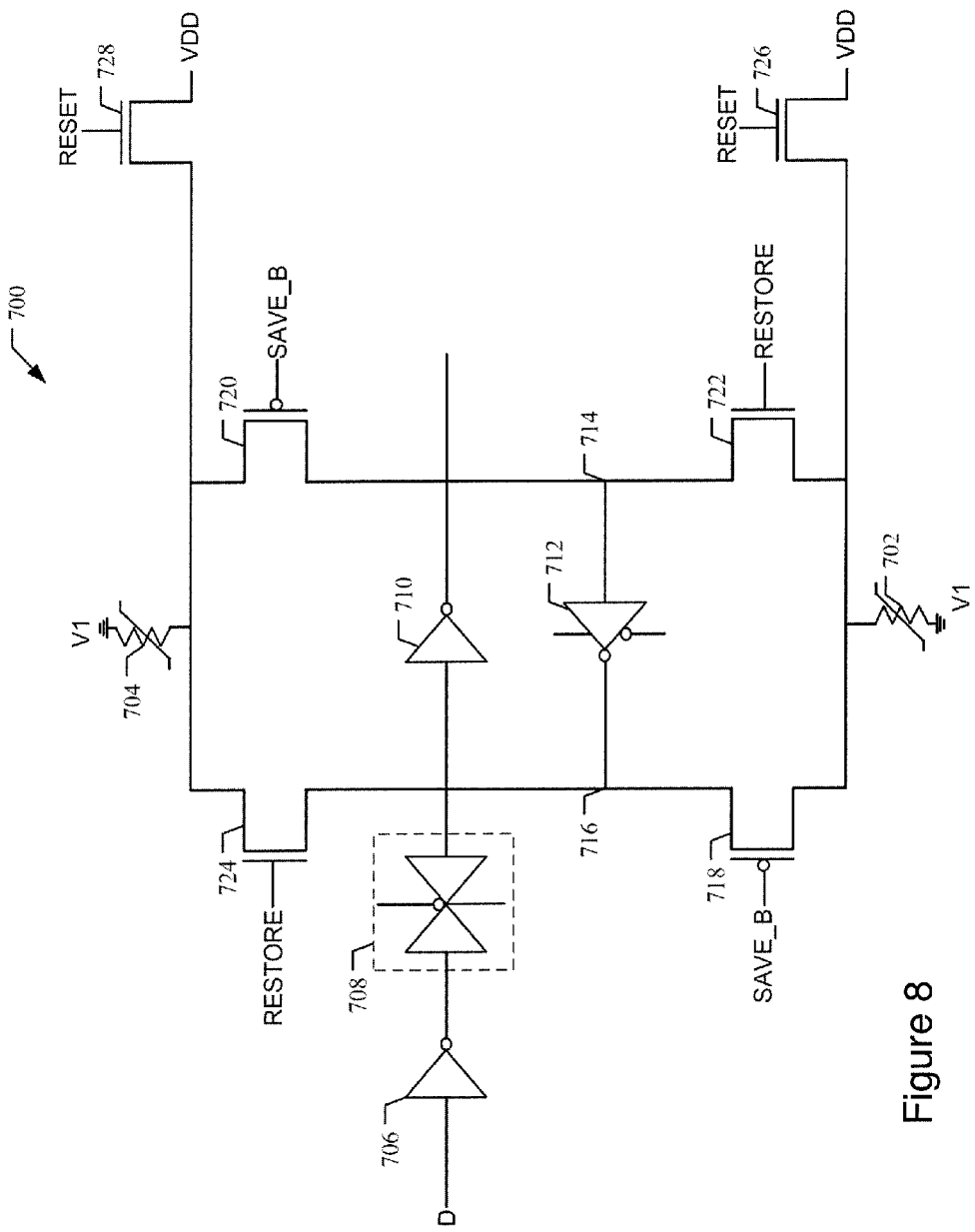
FIG. 8 illustrates an example CES element based latching circuitry having a write circuit, a restore circuit and a reset circuit.

FIG. 8 illustrates an example CES element based latching circuitry 700 having a write circuit, a restore circuit and a reset circuit. The latching circuitry 700 may be implemented as a latch in a live slave flip-flop or a live master flip-flop. The latching circuitry 700 comprises a first CES element 702 and a second CES element 704. Further, in a particular implementation, the latching circuitry 700 may operate in a manner such that it facilitates the CES elements 702 and 704 to switch states without using any external voltage supply. That is, the latching circuitry 700 may utilize the operational voltage of a device in which the latching circuitry 700 is implemented to facilitate switching of the CES element 202. The operational voltage of the device may be understood as a voltage at which the device operates. Additionally or alternatively, the latching circuitry 700 may utilize other voltages, for example, voltages derived from an internal voltage source or an external voltage source, to facilitate switching of the CES elements 702 and 704 to desired impedance states. Further, the at least one control signal includes a write enable signal (denoted by SAVE), a restore signal (denoted by RESTORE), and a reset signal (denoted by RESET). In an example, the WRITE signal, the RESTORE signal, and the RESET signal are asserted in a non-overlapping manner, i.e. only one of the WRITE signal, the RESTORE signal, and the RESET signal is asserted at one time.

The latching circuitry 700, in an example, comprises a write circuit, a restore circuit, and a reset circuit. The write circuit is configured to store data using the CES elements 702 and 704. The restore circuit is configured to restore a state of at least one latch node of the latching circuitry 700 based upon the impedance state of the CES elements 702 and 704. The reset circuit is configured to reset the CES elements 702 and 704 to a defined impedance state.

In an example, the latching circuitry 700 comprises an inverter 704, a transmission gate 708, a driver inverter 710, and a feedback inverter 712, a latch node 714, and a latch node 716. The data (denoted by D in FIG. 8) is provided as an input to the inverter 704.

The write circuit of the latching circuitry 700 comprises a transistor 718 and a transistor 720. In an example, the transistor 718 and the transistor 720 may be PMOS transistors. The gate inputs of the transistor 718 and the transistor 720 are configured to receive a complementary SAVE signal, (denoted by SAVE_B). A drain input of the transistor 718 is coupled to a first input of the first CES element 702. A second input of the CES element 702 is configured to receive a voltage supply V1. A drain input of the transistor 720 is coupled to a first input of a second CES element 704. A second input of the CES element 704 is configured to receive the voltage supply V1. In an example, the supply V1 may be a ground node or GND source.

In this example, for storing the state of the latching circuitry 700, the SAVE signal is pulled high and thus, the SAVE_B signal is pulled low. This causes the transistors 708 and 714 to switch ON. In an embodiment, the CES elements 702 and 704 are programmed to a high impedance state. When the latch node 714 is at logic zero, the latch node 716 is at logic one. As a result, a supply voltage VDD is applied across the CES element 702 via the latch node 716 and the transistor 718. In an example, VDD may be greater than or equal to the SET voltage of the CES element 702. Further, the transistor 708 may be designed so as to provide a current density required for the SET state. Thus, in this example, the CES element 702 is programmed to the SET state, i.e., to a low impedance state. In addition, as the latch node 714 is at logic zero, the voltage across the CES element 704 is close to zero. Hence, the CES element 704 does not change the impedance state and remains in the high impedance state.

When the latch node 714 is at logic one, the latch node 716 is at logic zero. As a result, a supply voltage VDD is applied across the CES element 704 via the latch node 714 and the transistor 720. In an example, VDD may be greater than or equal to the SET voltage of the CES element 704. Further, the transistor 720 may be designed so as to provide a current density required for the SET state. Thus, in said case, the CES element 704 is programmed to the SET state, i.e., to the low impedance state. In addition, as the latch node 716 is at logic zero, the voltage across the CES element 702 is close to zero. Hence, the CES element 702 does not change the impedance state and remains in the high impedance state.

In an example, in both the above cases, when the VDD is not sufficient to program either of the CES element 702 and the CES element 704 into the low impedance state, an external voltage booster (not shown in FIG. 8), for example, a PMIC, may be used. In another example, an additional voltage controller (not shown in FIG. 8) may be used for boosting up the voltage to the SET voltage.

The restore circuit comprises a transistor 722 and a transistor 724. In an example, the transistors 722 and 724 are NMOS transistors. The gate inputs of the transistors 722 and 724 are configured to receive the RESTORE signal. A drain input of the transistor 722 is coupled to the latch node 714. A source input of the transistor 722 is coupled to the first input of the CES element 702. A drain input of the transistor 724 is coupled to the latch node 716. A source input of the transistor 724 is coupled to the first input of the CES element 704.

In an example, the restore circuit is configured to restore a state of the latch node 714 when the latching circuitry 700 powers up. In restore operation, the RESET signal is asserted, i.e., pulled high and the transistors 722 and 724 are switched ON. When the CES element 702 is in the low impedance state and the RESTORE signal is asserted, the state of the latch node 714 is restored to logic zero. Similarly, when the CES element 704 is in the low impedance state and the RESTORE signal is asserted, the state of the latch node 714 is restored to logic one. A detailed description of the operation of the restore circuit is provided below with reference to FIG. 9 and FIG. 10.

The reset circuit comprises a transistor 726 and a transistor 728. In an example, the transistors 726 and 728 may be NMOS transistors. The gate inputs of the transistors 726 and 728 are configured to receive the RESET signal. Further, a drain input of the transistor 726 is configured to receive the VDD. A source input of the transistor 726 is coupled to the first input of the CES element 702. A source input of the transistor 728 is configured to receive the VDD. A source input of the transistor 728 is coupled to the first input of the CES element 704. The transistors 726 and 728 are designed to introduce a voltage drop when switched ON.

As mentioned above, the reset circuit is configured to program the CES elements 702 and 704 to a defined impedance state. In an example, the defined impedance state is a high impedance state. In a reset operation, the RESET signal is asserted, i.e. pulled high. As a result, the transistors 726 and 728 are switched ON.

The transistor 726 causes a voltage drop Vth and thus, the effective voltage applied across the CES element 702 is VDD minus Vth. In an example, the effective voltage may be greater than or equal to the RESET voltage of the CES element 702. Further, the transistor 726 may be designed in a manner so as to provide a current density required for the RESET state. Thus, the transistor 726 causes the CES element 702 to switch to the RESET state or the high impedance state. In an example, VDD may be 1.2 and the Vth may be 0.6, but these are merely illustrative, non-limiting example values. Similarly, the transistor 728 may cause the CES element 704 to switch to the high impedance state.

Figure 9:
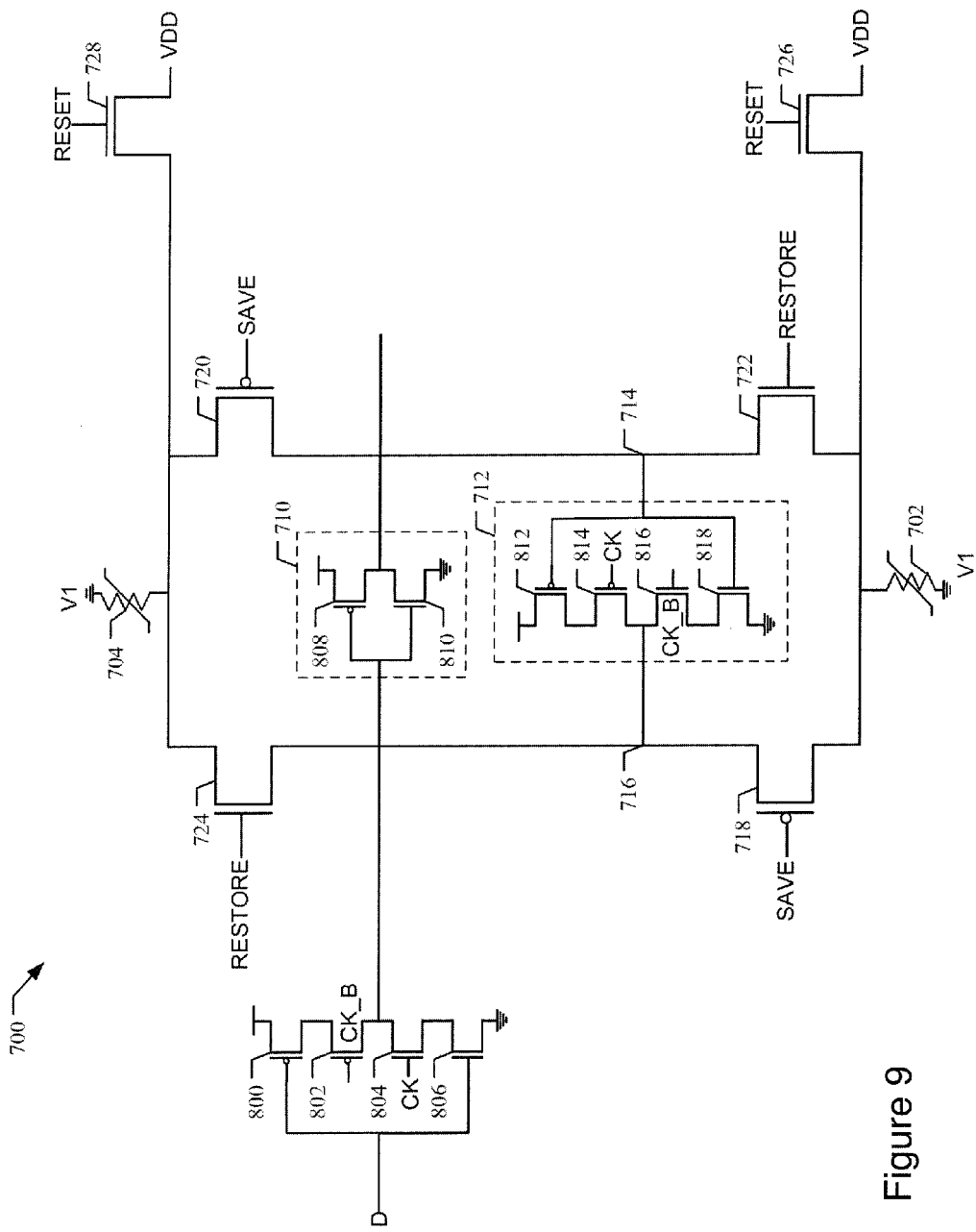
FIG. 9 illustrates an example restore circuit for a CES element based latch.

Operation of the restore circuit of the latching circuitry 700 is described in more detail with reference to FIG. 9. As shown, the inverter 706 and the transmission gate 708 may be implemented using a transistor 800, a transistor 802, a transistor 804, and a transistor 806. The driver inverter 710 may include a transistor 808, and a transistor 810. The feedback inverter 714 may include a transistor 812, a transistor 814, a transistor 816, and a transistor 818. In an example, the transistors 800, 802, 808, 812, and 814 may be PMOS transistors and the transistors 804, 806, 816, and 818 may be NMOS transistors.

In an example, gate inputs of the transistors 800 and 806 are configured to receive the data D. Gate inputs of transistors 804 and 802 are configured to receive a clock signal (denoted by CK) and a complementary clock signal (denoted by (CK_B), respectively. Gate inputs of the transistor 808 and the transistor 810 are coupled to the latch node 716. Gate inputs of the transistors 812 and transistor 818 are coupled to the latch node 714. Gate inputs of the transistors 814 and the transistor 816 are configured to receive the CK signal and the CK_B signal, respectively.

In a restore operation, the RESTORE signal is asserted, i.e., pulled high. As a result, the transistors 722 and 724 are switched ON. Further, the CK signal is pulled low. As a result, the transistors 802 and 804 are switched OFF and the transistors 814 and 816 are switched ON.

In one example, where the saved state of the latch node 714 was logic one and when the latch node 714 powers up in logic zero (as a result, the latch node 716 is in logic one), the restore circuit is configured to restore the latch node 714 to its proper state. When the saved state of the latch node 714 was logic one, the CES element 704 is in the low impedance state and the CES element 702 is in the high impedance state. In this example, a current flows from VDD, the transistors 812, 814, the transistor 724 and the CES element 704. By designing the transistors 812 and 814 appropriately, the latch node 716 is pulled low as the CES element 704 is in the low impedance state. Consequently, the latch node 714 is pulled high due to the transistor 808. Further, the transistors 814 and 816 provide a positive feedback. As a result, the latch node 714 restores to its proper state, i.e., logic one.

In another example, where the saved state of the latch node 714 was logic zero and where the latch node 714 abruptly powers-up in logic one (as a result, the latch node 716 is in logic zero), the restore circuit is configured to restore the latch node 714 to its proper state. In this example, a current flows from VDD, the transistor 808, the transistor 722 and the CES element 702. The transistor 808 may seek to pull the latch node 714 high and the CES element 702 being in the low impedance state may seek to pull the latch node 714 low. Appropriate design of the transistor 808 and the CES element 702 and a positive feedback provided by the feedback inverter 706 may weaken the transistor 808, and the latch node 714 is pulled low, i.e., to logic zero, thereby restoring the latch node 714 to its proper state.

Figure 10:
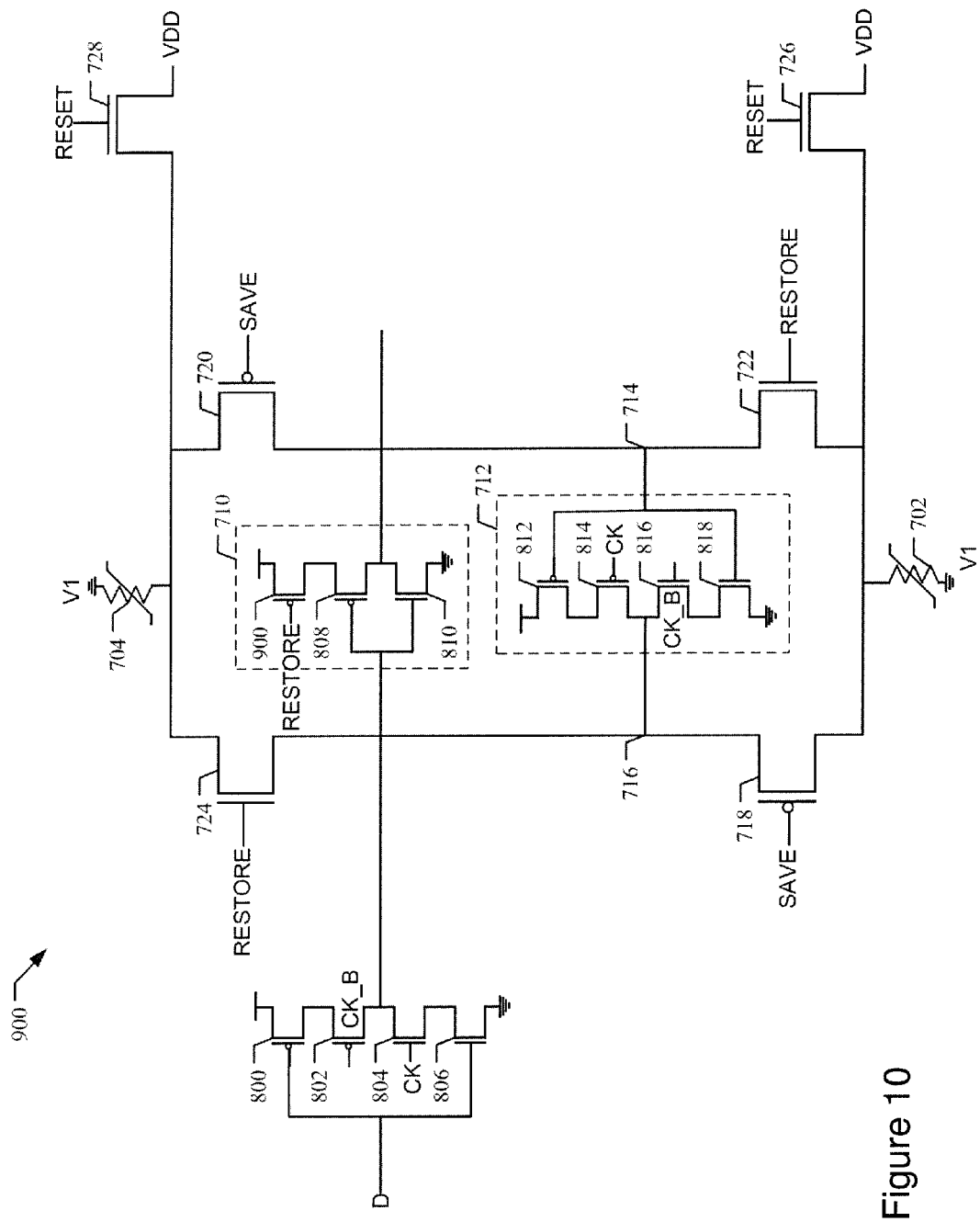
FIG. 10 illustrates an example CES element based latch configured to receive a RESTORE signal.

FIG. 10 illustrates an exemplary CES based latching circuitry 900 configured to receive a RESTORE signal. In this embodiment, the driving inverter 710 may include a transistor 902. The transistor 902 may be connected to the transistor 808 as shown in FIG. 9. In an example, the transistor 902 may be a PMOS transistor. A gate input of the transistor 902 is configured to receive the RESTORE signal.

In operation, when the RESTORE signal is asserted, i.e., pulled high, the transistor 902 is switched OFF. This causes a circuit path through the transistor 808 to break. As a result, the transistor 722 and the CES element 702 are able to pull the latch node 714 to a low state without any contention. Thus, the latch node 714 is restored to its proper state of logic zero.

Further, for restoring the latch node 714 to its proper state when it powers up into an abrupt state of logic zero, the latching circuitry 900, as described herein, is configured to operate in a similar manner as described above in FIG. 9 for restoring the latch node 714 to its proper state of logic one.

Figure 11:
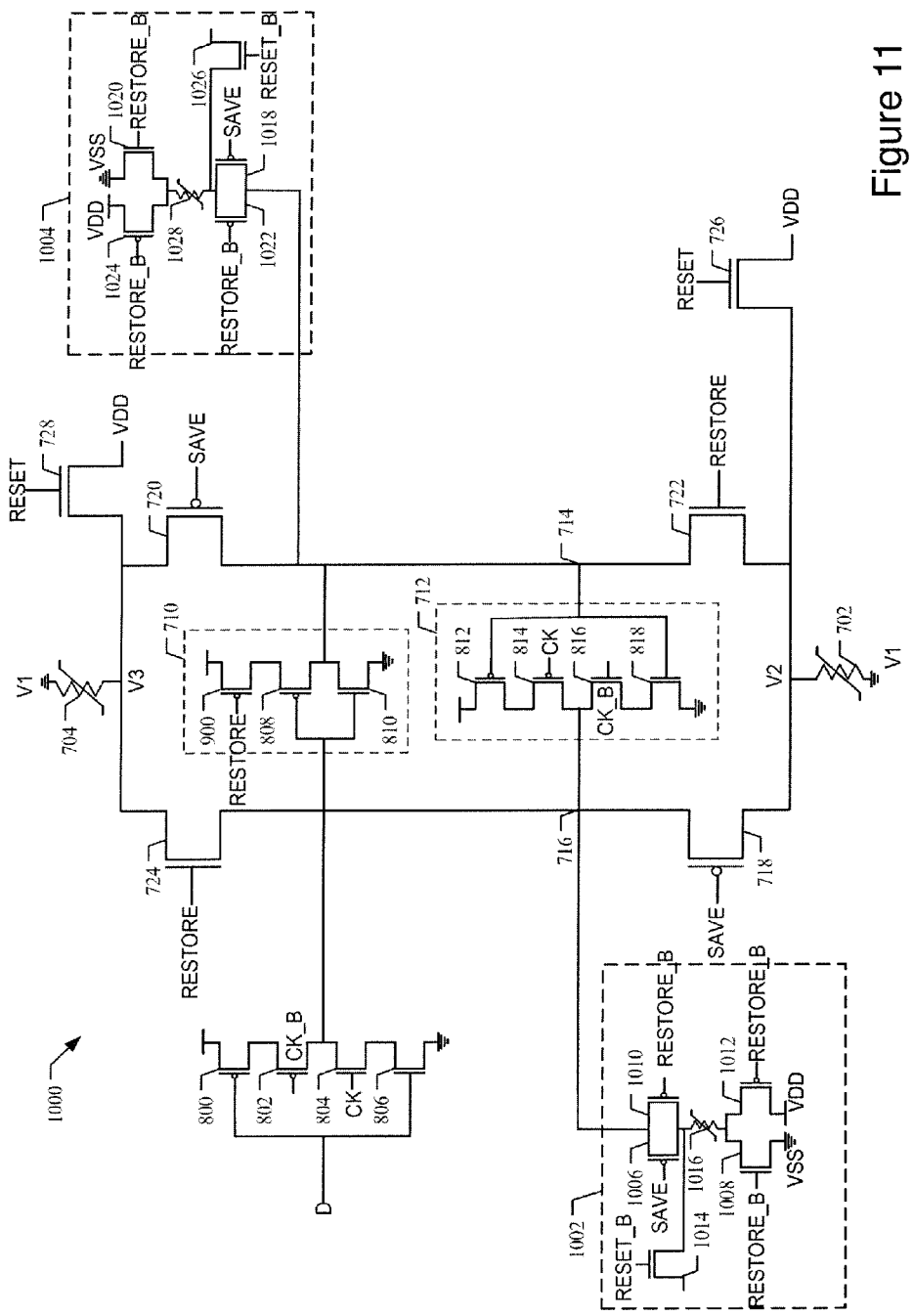
FIG. 11 illustrates an example CES element based latch configured to receive a RESTORE signal and a complementary RESTORE signal.

FIG. 11 illustrates an example CES element based latching circuitry 1000 configured to receive a RESTORE signal and a complementary RESTORE signal. The latching circuitry 1000 is similar to the latching circuitry 900 except the latching circuitry 1000 further comprises a circuit 1002 and a circuit 1004. In addition to the various control signals described previously, the at least one control signal further includes a complementary restore signal (denoted by RESTORE_B). In an example, any of the control signals may be applied in a non-overlapping manner, i.e. only one control signal is asserted at one time.

The circuit 1002 comprises a transistor 1006, a transistor 1008, a transistor 1010, a transistor 1012, and a transistor 1014, and a CES element 1016. In an example, the transistors 1006, 1010, and 1012 may be PMOS transistors, and the transistors 1008 and 1014 may be NMOS transistors. A gate input of the transistor 1006 is configured to receive the SAVE signal. Gate inputs of the transistors 1008, 1010, and 1012 are configured to receive the RESTORE_B signal. A gate input of the transistor 1014 is configured to receive the RESET_B signal. A first input of the CES element 1016 is coupled to drain inputs of the transistors 1006 and 1010. A second input of the CES element 1016 is coupled to source inputs of the transistors 1008 and 1012.

The circuit 1004 comprises transistors 1018, 1020, 1022, 1024, and 1026, and a CES element 1028. In an example, the transistors 1018, 1022, and 1024 may be PMOS transistors, and transistors 1020 and 1026 may be NMOS transistors. A gate input of the transistor 1018 is configured to receive the SAVE signal. Gate inputs of the transistors 1020, 1022, and 1024 are configured to receive the RESTORE_B signal. A gate input of the transistor 1026 is configured to receive the RESET_B signal. A first input of the CES element 1028 is coupled to drain inputs of the transistors 1018 and 1022 and 1010. A second input of the CES element 1028 is coupled to drain inputs of the transistors 1020 and 1024.

The circuits 1002 and 1004 are configured to restore the state of the latch node 714 based upon an impedance state of the CES elements 1016 and 1028. Furthermore, the transistors 1014 and 1026 are configured to reset the CES elements 1016 and 1028, respectively, to a defined impedance state.

For storing the data, the SAVE signal is asserted, i.e., pulled high, and consequently, the SAVE_B signal is pulled low. As a result, transistors, 718, 720, 1006, and 1018 are switched ON. Further, the RESTORE signal is pulled low. As a result, the transistors 1008 and 1020 are switched ON.

When the latch node 714 is at logic zero, the latch node 716 is at logic one. The latch node 716, along with the transistor 718 programs the CES element 702 to a low impedance state in a manner as described above in FIG. 8. Additionally, the whole of supply voltage VDD is applied across the CES element 1016 through the latch node 716, transistor 1006, and the transistor 1008. In an example, the VDD is equal to or greater than a SET voltage of the CES element 1016. In an example, the VDD is equal to about 1.2V, but this is merely an illustrative, non-limiting example value. Further, the transistors 1006 and 1008 are designed in a manner so as to supply a current density required for the SET state. Thus, the CES element 1016 is programmed to the SET state.

When the latch node 714 is at logic one, the latch node 714 along with transistor 720 programs the CES element 704 to the low impedance or SET state in a manner as described in FIG. 8. In addition, the supply voltage VDD is applied across the CES element 1028 through the latch node 714, the transistors 1018 and 1020. In an example, the VDD is equal to or greater than the SET voltage. Further, the transistors 1018 and 1020 are designed in a manner so as to supply a current density required for the SET state. Thus, the CES element 1028 is programmed to the SET state or the low impedance state.

For restoring the data, the RESTORE signal is pulled high and thus, the RESTORE_B signal goes low. As a result, the transistors 722, 724, 1010, 1012, 1022, and 1024 are switched ON.

When the latch node 714 was saved from logic zero state and when the latch node 714 powers up abruptly to logic one (the latch node 716 being at logic zero now), the CES element 702 facilitates restoration of the state of the latch node 714 to logic zero in a manner as described above in FIG. 8. Additionally, the latch node 716 is connected to the VDD through the transistors 1010 and 1012, and the CES element 1016, which in the low impedance state. Thus, the latch node 714 is restored to its proper state.

When the latch node 714 was saved from logic one state and when the latch node 714 powers up abruptly to logic zero (the latch node 716 being at logic one now), the CES element 704 facilitates restoration of the state of the latch node 716 to logic zero in a manner as described above in FIG. 8. Additionally, the latch node 714 is connected to the VDD through the transistors 1022 and 1024, and the CES element 1028. As a result, the latch node 714 is pulled up and restored to its proper state of logic one.

For resetting the CES elements 1016 and 1028, the RESET_B signal is pulled high. As a result, the transistors 1014 and 1026 are switched ON. In an example, the transistor 1014 is designed in a manner so as to provide a voltage drop Vth. Thus, when switched ON, the effective voltage supplied across the CES element 1016 is VDD minus Vth. In an example, the effective voltage is equal to or greater than the RESET voltage of the CES element 1016. Further, the transistor 1014 is designed to provide a current density greater than or equal to a threshold current density required to program the CES element 106 to the RESET state. Thus, the CES element 1016 is programmed to the RESET state or the high impedance state. The transistor 1026 is designed in a manner similar to that of the transistor 1014 and when switched ON, programs the CES element 1028 to the RESET state or high impedance state in the same manner as CES element 1016 is programmed to the high impedance state.

Figure 12:
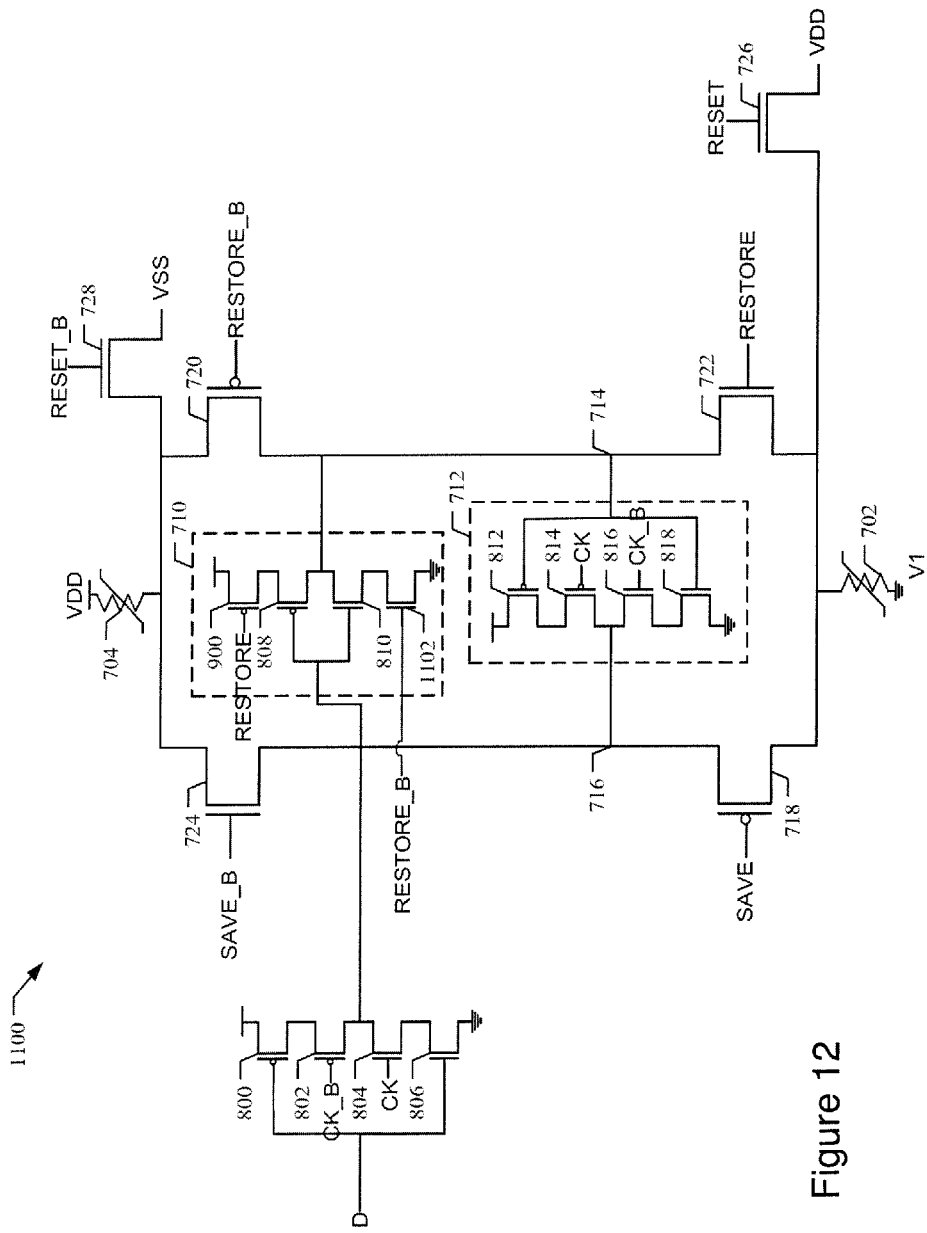
FIG. 12 illustrates an example CES element based latching circuitry configured to restore a state of a node of the latching circuitry.

FIG. 12 illustrates an exemplary CES element based latching circuitry 1100 configured to restore a state of a node of the latching circuitry. The latching circuitry 1100 is a variation of the latching circuitry 700. In this embodiment, the data is stored from the latch node 716 only, and the data is restored from the latch node 714 only. In an example, the latching circuitry 1100 is configured to store data using the CES elements 702 and 704, and to restore a state of at least one node of the latching circuitry 1100 based on an impedance state of the CES elements 702 and 704. Further, the latching circuitry 1100 is configured to reset the CES elements 702 and 704 to a defined state. In an example, any of the control signals may be applied in a non-overlapping manner, i.e. only one control signal is asserted at one time.

The latching circuitry 1100 comprises a transistor 1102 as shown in FIG. 12. A drain input of the transistor 1102 may be coupled with a source input of the transistor 810 and a gate input of the transistor 1102 may be configured to receive the RESTORE_B signal. Thus, the driver inverter 710 is gated using the RESTORE signal in this embodiment. Further, in the latching circuitry 1100, the gate input of the transistor 720 is configured to receive the RESTORE_B signal, the gate input of the transistor 724 is configured to receive the SAVE_B signal, the gate input of the transistor 726 is configured to receive the RESET signal, and the gate input of the transistor 728 is configured to receive a complementary RESET_B signal (denoted by RESET_B). A source input of the transistor 728 is configured to receive a supply voltage VSS. Further, the second input of the CES element 704 is configured to receive the supply VDD.

For storing the data, the SAVE signal is pulled high (which causes the SAVE_B signal to go low). As a result, the transistors 718 and 724 are switched ON. When the latch node 714 is at logic 0, the latch node 716 is at logic one. Also, the CK signal is at logic one which switches ON the transistor 802. As a result, the VDD is applied across the CES element 702 through the transistors 800 and 802, the latch node 716, and the transistor 718. In an embodiment, VDD is equal to or greater than a SET voltage of the CES element 702. In an example, the VDD is equal to about 1.2V, but this is merely an illustrative, non-limiting example value. Further, the transistors 800, 802, and 718 are designed in a manner so as to supply a current density required for the SET state. Thus, the CES element 1016 is programmed to the SET state.

When the latch node 714 is at logic 1, the latch node 716 is at logic zero. As a result, the VDD is applied across the CES element 704 through the transistor 724, the latch node 716 and the transistors 804 and 806. As mentioned, when the VDD is equal to or greater than the SET voltage and when the transistor 724 is designed in a manner so as to supply a current density required for the SET state, the CES element 704 is programmed to the SET state.

For restoring the data, the RESTORE signal is pulled high (which causes the RESTORE_B to go low). As a result, the transistor 722 and 720 are switched ON. When the latch node 714 was saved from logic zero state and when the latch node 714 powers up abruptly to logic one, the latch node 714 is restored to its proper state by the CES element 702 (which is in low impedance state). In this case, the CES element 702 pulls the latch node 714 low due to its low impedance state. As a result, the latch node 714 is restored to its proper state of logic zero. Additionally, as the driver inverter 710 is gated, i.e., gate inputs of the transistor 900 and transistor 1102 are configured to receive the RESTORE signal and the RESTORE_B signal, respectively, contention in the latching circuitry 1100 is avoided. Once the latch node 714 is at logic zero, the latch node 716 is pulled high by the feedback inverter 712.

In another case, when the latch node 714 was saved from logic one state and when the latch node 714 powers up abruptly to logic zero, the latch node 714 is returned to its proper state by the CES element 704. In this example, the latch node 714 is pulled high to VDD via the CES element 704 and the transistor 720, thereby returning the latch node 714 to its proper state of logic one. Once the latch node 714 is high, the latch node 716 is pulled to low due to the feedback inverter 712.

For resetting the CES elements 702 and 704, the RESET signal is pulled high (which causes the RESET_B signal to go low). As a result, the transistors 726 and 728 are switched ON. In an example, the transistor 726 is designed in a manner so as to provide a voltage drop Vth and provide a current density greater than or equal to a threshold current density required to switch the CES element 702 to the RESET state. Thus, when switched ON, the effective voltage supplied across the CES element 702 is VDD minus Vth. In an embodiment, the effective voltage is equal to or greater than the RESET voltage of the CES element 702 and the CES element 702 is programmed to the RESET state or the high impedance state.

On the other hand, the transistor 728 resets the CES element 704. The transistor 724 affects (causes) a voltage drop of VDD minus Vth (Vth being the voltage drop associated with the transistor 728), across the CES element 704. Further, the transistor 728 may be designed to provide a current density greater than or equal to a threshold current density required to switch the CES element 704 to the RESET state. In an embodiment, the effective voltage is equal to or greater than the RESET voltage of the CES element 704 and the CES element 704 is programmed to the RESET state or the high impedance state.

Figure 13:
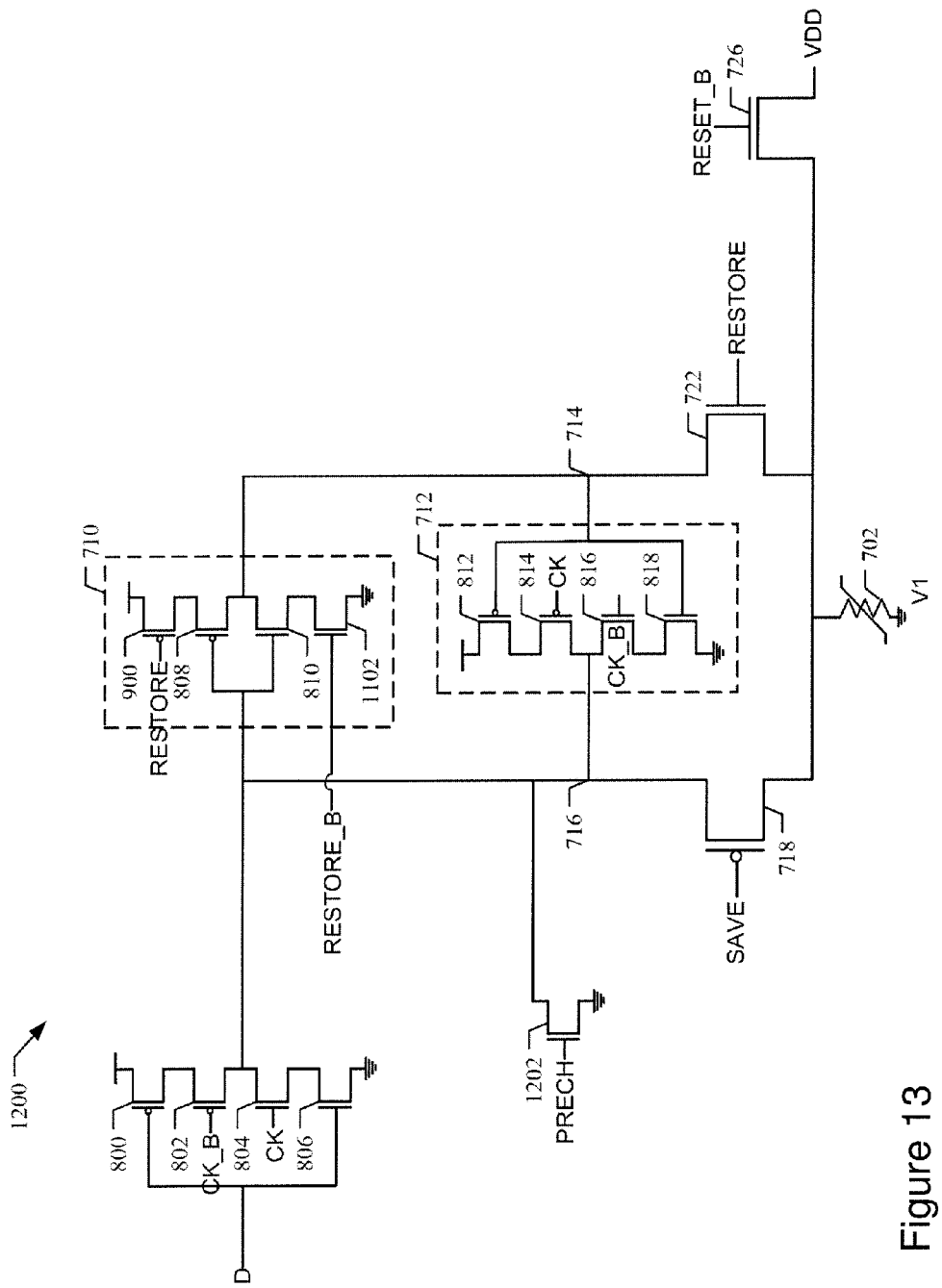
FIG. 13 illustrates an example CES element based latch configured to receive a pre-recharge signal.

FIG. 13 illustrates an example CES element based latching circuitry 1200 configured to receive a pre-recharge signal. In an example, the latching circuitry 1200 is configured to store data using the CES element 702, and restore a state of at least one node of the latching circuitry 1200 based on an impedance state of the CES element 702. Further, the latching circuitry 1200 is configured to reset the CES element 702 to a defined state. In addition to the various control signals described previously, the at least one control signal further includes a pre-recharge signal (denoted by PRECH). In an example, any of the control signals may be applied in a non-overlapping manner, i.e. only one control signal is asserted at one time.

The latching circuitry 1200 comprises a transistor 1202. A gate input of the transistor 1202 is configured to receive the PRECH signal.

For storing the data, the SAVE signal is pulled low which switches on the transistor 718. When the latch node 714 is at logic zero, the latch node 716 is at logic one. As a result, the VDD is applied across the CES element 702. In an example, VDD is equal to or greater than the SET voltage of the CES element 702. Further, the transistor 718 is configured to provide a current density required for the SET state. Thus, the CES element 702 is programmed to the SET state, i.e., the low impedance state. In another case, when the latch node 714 is at logic one and the latch node 716 is at logic zero, the voltage across the CES element 702 is about zero. Thus, the CES element 702 remains in the RESET state, i.e., a high impedance state.

In restore operation, upon power-up, the PRECH signal is asserted, i.e., pulled high. As a result, the transistor 1202 is switched ON. The transistor 1202 ensures that the latch node 714 is at logic one. For instance, in a case where the latch node 714 powers up at logic zero, the latch node 716 is at logic 1 due to the feedback inverter 712. In this example, the transistor 1202 is designed in a manner so as to pull the latch node 716 low. As a result, the latch node 714 is pulled high to logic one. In another case where the latch node 714 powers up at logic one, the latch node 716 is at logic zero due to the feedback inverter 712. Further, the transistor 1202 ensures that the latch node 716 remains at logic zero. Thus, upon power-up, the latching circuitry 1200 restores to the latch node 714 at logic one and the latch node 716 at logic zero irrespective of the state the latching circuitry 1200 powers up.

Once the aforesaid state is restored, the PREACH signal is pulled low and the RESTORE signal is pulled high. When the RESTORE is pulled high, the transistor 722 is switched ON. Further, transistors 902 and 1102 are switched OFF and the driver inverter 710 is disabled. The latch node 714 is already at the logic one state. If the latch node 714 was saved from the logic one state, the latch node 714 is already restored to its correct state. On the other hand, when the latch node 714 was saved from logic zero state, the CES element 702, being in the low impedance state, pulls the latch node 714 low. Thus, the latch node 714 is restored to its proper state.

The latching circuitry 1200 performs the reset operation in a manner as described previously in FIG. 8 and the latching circuitry 1200 resets the CES element 702 to a high impedance state.

In some embodiments A device may comprise a latching circuitry, the latching circuitry comprising: at least one correlated electron random access memory (CES) element; and a control circuit coupled to the at least one CES element, wherein the control circuit is configured to: receive at least one control signal; and perform at least one of storing data and outputting data based on the at least one CES element and the at least one control signal. The control circuit may comprise a write circuit, wherein the write circuit is configured to: receive data; and program the at least one CES element into one of a plurality of impedance states based on the received data. The control circuit may comprise a read circuit, wherein the read circuit is configured to output the stored data based on an impedance state of the at least one CES element. The control circuit may comprise a restore circuit, wherein the restore circuit is configured to restore a state of the latching circuitry based on an impedance state of the at least one CES element.

The write circuit may be configured to program the at least one CES element to a first impedance state when the data is at a first logic level; and program the at least one CES element to a second impedance state when the data is at a second logic level. The write circuit may comprise a first transistor, a second transistor, and a third transistor, wherein: a source input of the first transistor is configured to receive a first supply; a drain input of the first transistor is coupled to a corresponding source input of each of the second transistor and the third transistor; a gate input of the second transistor is configured to receive the data; a drain input of the second transistor is coupled to a first input of the CES element; a gate input of the third transistor is configured to receive the data; and a drain input of the third transistor is coupled to the first input of the CES element. The second transistor may be enabled when the data is at the first logic level; and the third transistor may be disabled when the data is at the first logic level. The second transistor may be configured to cause a voltage drop when enabled. The second transistor may be disabled when the data is at the second logic level; and the third transistor may be enabled when the data is at the second logic level.

The read circuit may comprise, an output node, a first transistor, a second transistor, and a third transistor, wherein: a source input of the first transistor is configured to receive a first supply; a gate input of the first transistor is configured to receive the at least one control signal; a drain input of the first transistor is connected to the output node; a source input of the second transistor is connected to the output node; a gate input of the second transistor is configured to receive the at least one control signal; a drain input of the second transistor is connected to a source input of the third transistor; a source input of the third transistor is connected to the drain input of the second transistor and a first input of the at least one CES element, and wherein a second input of the at least one CES element is coupled to a second supply; a gate input of the third transistor is configured to receive the at least one control signal; and a drain input of the third transistor is connected to the second supply. The read circuit may be configured to: provide a first output at the output node based when the at least one CES element is at a first impedance state; and provide a second output at the output node when the at least one CES element is in a second impedance state. An impedance value of the first transistor and the third transistor may be equal to at least twice an impedance value of the second transistor.

The write circuit may comprise a first transistor, a second transistor, and a third transistor, wherein: a source input of the first transistor is coupled to a source input of the second transistor, and wherein the source input of the first transistor is configured to receive a first supply; a gate input of the first transistor is configured to receive the data; a body input of the first transistor is configured to receive a second supply; a drain input of the first transistor is coupled to a source input of the third transistor; a source input of the second transistor is coupled to the source input of the first transistor, and wherein the source input of the second transistor is configured to receive the first supply; a gate input of the second transistor is coupled to the data; a body input of the second transistor is coupled to the source input of the second transistor; a drain input of the second transistor is coupled to the source input of the third transistor; a body input of the third transistor is configured to receive the first supply; and a drain input of the third transistor is coupled to a first input of the at least one CES element, and wherein a second input of the at least one CES element is coupled to a third supply. The first transistor may be enabled when the data is at the first logic level; and the second transistor may be disabled when the data is at the first logic level. The first transistor may be configured to cause a voltage drop when enabled. The first transistor may be disabled when the data is at the second logic level; and the second transistor may be enabled when the data is at the second logic level.

The read circuit may comprise an output node, a first transistor, and a second transistor, wherein: a source input of the first transistor is configured to receive a first supply; a gate input of the first transistor is configured to receive the at least one control signal; a drain input of the first transistor is connected to the output node; a source input of the second transistor is connected to the output node; a gate input of the second transistor is configured to receive the at least one control signal; and a drain input of the second transistor is connected to a first terminal of the at least one CES element, and wherein a second input of the at least one CES element is coupled to a second supply. The read circuit may be configured to: provide a first output at the output node based when the at least one CES element is at a first impedance state; and provide a second output at the output node when the at least one CES element is in a second impedance state.

The write circuit may comprise: a first transistor stack configured to program the at least one CES element to a first impedance state from the plurality of impedance states when the data is at a first logic level; and a second transistor stack configured to program the at least one CES element to a second impedance state from the plurality of impedance states when the data is at a second logic level. The first transistor stack may comprise a first transistor, a second transistor, a third transistor, and a fourth transistor, wherein: a gate input of the first transistor is configured to receive the data; a gate input of the second transistor is configured to receive a clock signal; a gate input of the third transistor is configured to receive a complementary data; and a gate input of the fourth transistor is configured to receive a complementary clock signal. The second transistor stack may comprise a fifth transistor, a sixth transistor, a seventh transistor, and an eighth transistor, wherein: a gate input of the fifth transistor is configured to receive complementary data; a gate input of the sixth transistor is configured to receive a complementary clock signal; a gate input of the seventh transistor is configured to receive the complementary data; and a gate input of the eighth transistor is configured to receive a clock signal. The fifth transistor may be configured to cause a first voltage drop in the write circuit for programming the at least one CES element to the second impedance state; and the sixth transistor may be configured to cause a second voltage drop in the write circuit for programming the at least one CES element to the second impedance state.

The read circuit may comprise a first transistor, a second transistor, a third transistor, and a fourth transistor wherein: the first transistor and the second transistor are coupled in series; and the third and the fourth transistor are coupled in series. When the at least one CES element is in a first impedance state, the read circuit may output a first output. When the at least one CES element is in a second impedance state, the read circuit may output a second output.

The restore circuit may comprise a first transistor and a second transistor wherein: a source input of the first transistor is configured to receive a first supply; a gate input of the first transistor is configured to receive a complementary at least one control signal; a drain input of the first transistor is coupled to a first node of the latching circuitry, wherein the first node is connected to a first input of the at least one CES element; a source input of the second transistor is configured to receive a second supply; a gate input of the second transistor is configured to receive the at least one control signal; and a drain input of the second transistor is coupled to a second node of the latching circuitry, wherein the second node is connected to a second input of the at least one CES element. The restore circuit may be configured to: program the first node of the latching circuitry to a first voltage when the at least one CES element is in a first impedance state; and program the first node of the latching circuitry to a second voltage when the at least one CES element is in a second impedance state.

The write circuit may comprise a first transistor, a second transistor, a third transistor, and a fourth transistor, wherein: a gate input of the first transistor is configured to receive the data; a gate input of the second transistor is configured to receive the data; a gate input of the third transistor is configured to receive a complementary at least one control signal; and a gate input of the fourth transistor is configured to receive the at least one control signal. The first transistor may be enabled when the data is at a first logic level; the second transistor may be disabled when the data is at the first logic level; and the at least one CES element is programmed to a first impedance state from the plurality of impedance states. The first transistor may be configured to cause a first voltage drop when enabled. The first transistor may be disabled when the data is at a second logic level; the second transistor may be enabled when the data is at the second logic level; and the at least one CES element is programmed to a second impedance state from the plurality of impedance states. The write circuit may further comprise a fifth transistor connected in series with the second transistor, wherein the fifth transistor is configured as a diode to provide a second voltage drop.

The restore circuit may comprise a first transistor and a second transistor, wherein: a source input of the first transistor is configured to receive a first supply; a gate input of the first transistor is configured to receive the at least one control signal, wherein the first transistor is enabled when the at least one control signal is asserted; a drain input of the first transistor is coupled to a first input of the at least one CES element; a source input of the second transistor is configured to receive a second supply; a gate input of the second transistor is configured to receive a complementary at least one control signal, and wherein the second transistor is enabled when the complementary at least one control signal is asserted; and a drain input of the second transistor is coupled to a second input of the at least one CES element. The restore circuit may be configured to program a first node of the latching circuitry to a first voltage when the at least one CES element is in a first impedance state; and program the first node of the latching circuitry to a second voltage when the at least one CES element is in a second impedance state, wherein the first node of the latching circuitry is connected to a first input of the at least one CES element.

The at least one CES element may comprise a first CES element and a second CES element.

The control circuit may comprise a write circuit, wherein the write circuit is configured to program the first CES element to a first impedance state when the data is at a first logic level, and to program the second CES element to the first impedance state when the data is at a second logic level.

The write circuit may comprise a first transistor and a second transistor, wherein: a gate input of the first transistor is configured to receive the at least one control signal; a drain input of the first transistor is coupled to a first input of the first CES element; a source input of the first transistor is coupled to a first latch node; a gate input of the second transistor is configured to receive the at least one control signal; a drain input of the second transistor is coupled to a first input of the second CES element; and a source input of the second transistor is coupled to a second latch node.

The control circuit may comprise a restore circuit configured to program at least one node of the latching circuitry to one of a first logic level and a second logic level based on an impedance state of at least one of the first CES element and the second CES element.

The restore circuit may comprise a first transistor and a second transistor, wherein:

a source input of the first transistor is coupled to a first node of the latching circuitry; a gate input of the first transistor is configured to receive the at least one control signal; a drain input of the first transistor is coupled to a first input of the first CES element, wherein a second input of the first CES element is coupled to a first supply voltage; a source input of the second transistor is coupled to a second node of the latching circuitry; a gate input of the second transistor is configured to receive the at least one control signal; and a drain input of the second transistor is coupled to a first input of the second CES element, wherein a second input of the first CES element is coupled to the first supply voltage.

The control circuit may comprise a reset circuit, wherein the reset circuit comprises: a first transistor coupled to a first input of the first CES element, wherein the first transistor is configured to program the first CES element into a first impedance state when the at least one control signal is asserted at a gate input of the first transistor, and wherein a second input of the first CES element is coupled to a first supply voltage; and a second transistor coupled to a first input of the second CES element, wherein the second transistor is configured to program the second CES element into the first impedance state when the at least one control signal is asserted at a gate input of the second transistor, and wherein a second input of the second CES element is coupled to the first supply voltage. The first transistor may be configured to cause a voltage drop when enabled. The second transistor may be configured to cause a voltage drop when enabled.

The restore circuit may be configured to disable a driver inverter of the latching circuitry based on the at least one control signal. The restore circuit may further comprise: a first circuit comprising a third CES element, wherein the first circuit is configured to program the first node to the first logic level based on an impedance state of the third CES element, and wherein the third CES element is programmed to the first impedance state when the data is at a first logic level; and a second circuit comprising a fourth CES element, wherein the second circuit is configured to program the first node to the second logic level based on an impedance state of the fourth CES element, and wherein the fourth CES element is programmed to the first impedance state when the data is at a second logic level. The first circuit may comprise a first transistor, a second transistor, a third transistor, a fourth transistor, and a fifth transistor, wherein: a gate input of the first transistor is configured to receive the at least one control signal, and wherein a drain input of the first transistor is coupled to a first input of the third CES element; a gate input of the second transistor is configured to receive the at least one control signal, and wherein a drain input of the second transistor is coupled to the first input of the third CES element; a gate input of the third transistor is configured to receive the at least one control signal, and wherein a source input of the third transistor is coupled to the first input of the third CES element; a gate input of the fourth transistor is configured to receive the at least one control signal, and wherein a source input of the fourth transistor is coupled to the first input of the third CES element; and a gate input of the fifth transistor is configured to receive the at least one control signal, and wherein a source input of the fifth transistor is coupled to the first input of the third CES element.

The second circuit may comprise a first transistor, a second transistor, a third transistor, a fourth transistor, and a fifth transistor, wherein: a gate input of the first transistor is configured to receive the at least one control signal, and wherein a drain input of the first transistor is coupled to a first input of the fourth CES element; a gate input of the second transistor is configured to receive the at least one control signal, and wherein a drain input of the second transistor is coupled to the first input of the fourth CES element; a gate input of the third transistor is configured to receive the at least one control signal, and wherein a source input of the third transistor is coupled to the first input of the fourth CES element; a gate input of the fourth transistor is configured to receive the at least one control signal, and wherein a source input of the fourth transistor is coupled to the first input of the fourth CES element; and a gate input of the fifth transistor is configured to receive the at least one control signal, and wherein a source input of the fifth transistor is coupled to the first input of the fourth CES element.

The write circuit may comprise a first transistor and a second transistor, wherein: a source input of the first transistor is coupled to a first node of the latching circuitry; a gate input of the first transistor is configured to receive the at least one control signal; a drain input of the first transistor is coupled to a first input of the first CES element; a source input of the second transistor is coupled to the first node of the latching circuitry; a gate input of the second transistor is configured to receive the at least one control signal; and a drain input of the second transistor is coupled to a first input of the second CES element.

The restore circuit may comprise a first transistor and a second transistor, wherein: a source input of the first transistor is coupled to a first node of the latching circuitry; a gate input of the first transistor is configured to receive the at least one control signal; a drain input of the first transistor is coupled to a first input of the first CES element, wherein a second input of the first CES element is coupled to a first supply voltage; a source input of the second transistor is coupled to the first node; a gate input of the second transistor is configured to receive the at least one control signal; and a drain input of the second transistor is coupled to a first input of the second CES element, wherein a second input of the second CES element is coupled to a second supply voltage.

The control circuit may comprise a reset circuit, wherein the reset circuit comprises: a first transistor coupled to a first input of the first CES element, wherein the first transistor is configured to program the first CES element into a first impedance state when the at least one control signal is asserted at a gate input of the first transistor, and wherein a second input of the first CES element is coupled to a first supply voltage; and a second transistor coupled to a first input of the second CES element, wherein the second transistor is configured to program the second CES element into a first impedance state when the at least one control signal is asserted at a gate input of the second transistor, and wherein a second input of the second CES element is coupled to a second supply voltage, and wherein a source input of the second transistor is configured to receive a third supply.

The write circuit may comprise a first transistor, wherein: a source input of the first transistor is coupled to a first node of the latching circuitry; a gate input of the first transistor is configured to receive the at least one control signal; a drain input of the first transistor is coupled to a first input of the at least one CES element, and wherein a second input of the CES element is configured to receive a first supply.

The restore circuitry may be configured to program to a first latch node of the latching circuitry to one of a first logic level and a second logic level based on an impedance state of the at least one CES element. The restore circuitry may comprise a first transistor, wherein: a source input of the first transistor is coupled to the first latch node of the latching circuitry; a gate input of the first transistor is configured to receive the at least one control signal; a drain input of the first transistor is coupled to a first input of the at least one CES element, and wherein a second input of the CES element is configured to receive a first supply. The restore circuit may be configured to force the at least one latch node to the second logic level. The control circuit may comprise a reset circuit configured to program the at least one CES element to a defined impedance state.

The reset circuit may comprise a first transistor, wherein: a source input of the first transistor is coupled to a first supply; and a gate input of the first transistor is configured to receive the at least one control signal; a drain input of the first transistor is coupled to a first input of the at least one CES element, and wherein a second input of the CES element is configured to receive a second supply. At least one control signal may comprise one of a read enable signal, a write enable signal, a read/write signal. At least one control signal may comprise a clock signal. At least one control signal may comprise a restore signal. The latching circuitry may comprise at least one of a latch or a flip-flip.

A method may comprise: receiving, by a latching circuitry, at least one control signal, wherein the latching circuitry comprises at least one correlated electron random access memory (CES) element; and performing at least one of storing data into the latching circuitry and outputting data from the latching circuitry based on the at least one control signal. The performing may comprise programming the at least one CES element into one of a plurality of impedance states based on the data. The performing may comprise outputting the data based on an impedance state of the at least one CES element. The method may further comprise restoring a state of the latching circuitry based on the at least one CES element.

Although illustrative embodiments of the disclosure have been described in detail herein with reference to the accompanying drawings, it is to be understood that the disclosure is not limited to those precise embodiments, and that various changes and modifications can be effected therein by one skilled in the art without departing from the scope and spirit of the disclosure as defined by the appended claims.

The invention claimed is:

1. A device comprising:
a latching circuitry, the latching circuitry comprising:
at least one correlated electron random access memory (CES) element; and
a control circuit coupled to the at least one CES element, wherein the control circuit is configured to:
receive at least one control signal; and
perform at least one of storing data and outputting data based on the at least one CES element and the at least one control signal,
wherein the control circuit comprises a write circuit, wherein the write circuit is configured to:
receive data;
program the at least one CES element into one of a plurality of impedance states based on the received data;
program the at least one CES element to a first impedance state when the data is at a first logic level; and
program the at least one CES element to a second impedance state when the data is at a second logic level,
and wherein the write circuit comprises a first transistor, a second transistor, and a third transistor, wherein:
a source input of the first transistor is configured to receive a first supply;
a drain input of the first transistor is coupled to a source input of the second transistor and a drain input of the third transistor;
a gate input of the second transistor is configured to receive the data;
a drain input of the second transistor is coupled to a first input of the CES element;
a gate input of the third transistor is configured to receive the data; and
a source input of the third transistor is coupled to the first input of the CES element.

2. The device as claimed in claim 1, wherein the control circuit comprises a restore circuit, wherein the restore circuit is configured to restore a state of the latching circuitry based on an impedance state of the at least one CES element.

3. The device as claimed in claim 1, wherein:
the second transistor is enabled when the data is at the first logic level; and
the third transistor is disabled when the data is at the first logic level.

4. The device as claimed in claim 3, wherein the second transistor is configured to cause a voltage drop when enabled.

5. The device as claimed in claim 1, wherein:
the second transistor is disabled when the data is at the second logic level; and
the third transistor is enabled when the data is at the second logic level.

6. The device as claimed in claim 1, wherein the write circuit comprises:
a first transistor stack configured to program the at least one CES element to a first impedance state from the plurality of impedance states when the data is at a first logic level; and
a second transistor stack configured to program the at least one CES element to a second impedance state from the plurality of impedance states when the data is at a second logic level.

7. A device comprising:
a latching circuitry, the latching circuitry comprising:

at least one correlated electron random access memory (CES) element; and
a control circuit coupled to the at least one CES element, wherein the control circuit is configured to:
receive at least one control signal; and
perform at least one of storing data and outputting data based on the at least one CES element and the at least one control signal, wherein the control circuit comprises a read circuit, wherein the read circuit is configured to output the stored data based on an impedance state of the at least one CES element,
wherein the read circuit comprises, an output node, a first transistor, a second transistor, and a third transistor, wherein:
a drain input of the first transistor is configured to receive a first supply;
a gate input of the first transistor is configured to receive the at least one control signal;
a source input of the first transistor is connected to the output node;
a drain input of the second transistor is connected to the output node;
a gate input of the second transistor is configured to receive the at least one control signal;
a drain input of the third transistor is connected to a source input of the second transistor and a first input of the at least one CES element, and wherein a second input of the at least one CES element is coupled to a second supply;
a gate input of the third transistor is configured to receive the at least one control signal; and
a source input of the third transistor is connected to the second supply.

8. The device as claimed in claim 7, wherein the read circuit is configured to:
provide a first output at the output node based when the at least one CES element is at a first impedance state; and
provide a second output at the output node when the at least one CES element is in a second impedance state.

9. The device as claimed in claim 7, wherein an impedance value of the first transistor and the third transistor is equal to at least twice an impedance value of the second transistor.

10. A device comprising:
a latching circuitry, the latching circuitry comprising:
at least one correlated electron random access memory (CES) element; and a control circuit coupled to the at least one CES element, wherein the control circuit is configured to:
receive at least one control signal; and
perform at least one of storing data and outputting data based on the at least one CES element and the at least one control signal,
wherein the control circuit comprises a write circuit, wherein the write circuit is configured to:
receive data;
program the at least one CES element into one of a plurality of impedance states based on the received data;
program the at least one CES element to a first impedance state when the data is at a first logic level; and
program the at least one CES element to a second impedance state when the data is at a second logic level, and
wherein the write circuit comprises a first transistor, a second transistor, and a third transistor, wherein:

a drain input of the first transistor is coupled to a source input of the second transistor, and wherein the drain input of the first transistor and the source input of the second transistor are configured to receive a first supply;
a gate input of the first transistor is configured to receive the data;
a body input of the first transistor is configured to receive a second supply;
a source input of the first transistor is coupled to a source input of the third transistor;
a gate input of the second transistor is coupled to the data;
a body input of the second transistor is coupled to the source input of the second transistor;
a drain input of the second transistor is coupled to the source input of the third transistor;
a body input of the third transistor is configured to receive the first supply; and
a drain input of the third transistor is coupled to a first input of the at least one CES element, and wherein a second input of the at least one CES element is coupled to a third supply.

11. The device as claimed in claim 10, wherein:
the first transistor is enabled when the data is at the first logic level; and
the second transistor is disabled when the data is at the first logic level.

12. The device as claimed in claim 11, wherein the first transistor is configured to cause a voltage drop when enabled.

13. The device as claimed in claim 10, wherein:
the first transistor is disabled when the data is at the second logic level; and
the second transistor is enabled when the data is at the second logic level.

14. A device comprising:
a latching circuitry, the latching circuitry comprising:
at least one correlated electron random access memory (CES) element; and a control circuit coupled to the at least one CES element, wherein the control circuit is configured to:
receive at least one control signal; and
perform at least one of storing data and outputting data based on the at least one CES element and the at least one control signal,
wherein the control circuit comprises a read circuit, wherein the read circuit is configured to output the stored data based on an impedance state of the at least one CES element, and
wherein the read circuit comprises an output node, a first transistor, and a second transistor, wherein:
a drain input of the first transistor is configured to receive a first supply;
a gate input of the first transistor is configured to receive the at least one control signal;
a source input of the first transistor is connected to the output node;
a drain input of the second transistor is connected to the output node;
a gate input of the second transistor is configured to receive the at least one control signal; and
a source input of the second transistor is connected to a first terminal of the at least one CES element, and wherein a second input of the at least one CES element is coupled to a second supply.

15. The device as claimed in claim 14, wherein the read circuit is configured to:

provide a first output at the output node based when the at least one CES element is at a first impedance state; and provide a second output at the output node when the at least one CES element is in a second impedance state.

16. A method comprising:

receiving, by a latching circuitry, at least one control signal, wherein the latching circuitry comprises at least one correlated electron random access memory (CES) element; and storing data into the latching circuitry and outputting data from the latching circuitry based on the at least one control signal, wherein storing data into the latching circuitry further comprises using a write circuit comprising a first transistor, a second transistor and a third transistor, wherein: a source input of the first transistor is configured to receive a first supply;

a drain input of the first transistor is coupled to a source input of the second transistor and a drain input of the third transistor;

a gate input of the second transistor is configured to receive the data;

a drain input of the second transistor is coupled to a first input of the CES element;

a gate input of the third transistor is configured to receive the data; and a source input of the third transistor is coupled to the first input of the CES element.

* * * * *